(12) United States Patent
Lee et al.

(10) Patent No.: US 10,468,594 B2
(45) Date of Patent: Nov. 5, 2019

(54) VARIABLE RESISTANCE MEMORY DEVICES

(71) Applicant: Samsung Electronics Co., Ltd., Suwon-si, Gyeonggi-do (KR)

(72) Inventors: Jin-Woo Lee, Seoul (KR); Soon-Oh Park, Suwon-si (KR); Jeong-Hee Park, Hwaseong-si (KR); Hideki Horii, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/358,544

(22) Filed: Nov. 22, 2016

(65) Prior Publication Data

US 2017/0288138 A1 Oct. 5, 2017

(30) Foreign Application Priority Data

Mar. 30, 2016 (KR) .................. 10-2016-0038071

(51) Int. Cl.
*H01L 45/00* (2006.01)
*H01L 27/24* (2006.01)

(52) U.S. Cl.
CPC ...... *H01L 45/1233* (2013.01); *H01L 27/2409* (2013.01); *H01L 27/2427* (2013.01); *H01L 27/2463* (2013.01); *H01L 27/2481* (2013.01); *H01L 45/06* (2013.01); *H01L 45/124* (2013.01); *H01L 45/126* (2013.01); *H01L 45/144* (2013.01); *H01L 45/1616* (2013.01); *H01L 45/1675* (2013.01)

(58) Field of Classification Search
CPC ..... H01L 45/04; H01L 45/06; H01L 45/1233; H01L 45/124; H01L 45/126; H01L 27/2427
See application file for complete search history.

(56) References Cited

U.S. PATENT DOCUMENTS 5,714,768 A * 2/1998 Ovshinsky .............. G11C 11/56
257/4
7,323,349 B2 1/2008 Hsu et al.
(Continued)

FOREIGN PATENT DOCUMENTS

KR 2011/0130862 A 12/2011

*Primary Examiner* — Scott B Geyer
(74) *Attorney, Agent, or Firm* — Harness, Dickey & Pierce, P.L.C.

(57) ABSTRACT

A variable resistance memory device includes a pattern of one or more first conductive lines, a pattern of one or more second conductive lines, and a memory structure between the first and second conductive lines. The pattern of first conductive lines extends in a first direction on a substrate, and the first conductive lines extend in a second direction crossing the first direction. The pattern of second conductive lines extends in the second direction on the first conductive lines, and the second conductive lines extend in the first direction. The memory structure vertically overlaps a first conductive line and a second conductive line. The memory structure includes an electrode structure, an insulation pattern on a central upper surface of the electrode structure, and a variable resistance pattern on an edge upper surface of the electrode structure. The variable resistance pattern at least partially covers a sidewall of the insulation pattern.

20 Claims, 41 Drawing Sheets

(56) References Cited

U.S. PATENT DOCUMENTS

| | | |
|---|---|---|
| 9,034,710 B2 | 5/2015 | Sills et al. |
| 9,093,641 B2 | 7/2015 | Liu et al. |
| 9,118,009 B2 | 8/2015 | Terai et al. |
| 9,130,163 B2 | 9/2015 | Tang |
| 9,136,307 B2 | 9/2015 | Pellizzer |
| 9,142,512 B2 | 9/2015 | Osaki et al. |
| 2007/0018149 A1* | 1/2007 | Sato ........................ H01L 45/06 257/4 |
| 2007/0096090 A1* | 5/2007 | Dennison ............ H01L 27/2427 257/42 |
| 2007/0279974 A1* | 12/2007 | Dennison ............ G11C 13/0004 365/163 |
| 2010/0190321 A1* | 7/2010 | Oh .......................... C23C 16/32 438/478 |
| 2011/0300685 A1* | 12/2011 | Horii ................... H01L 27/2409 438/382 |
| 2015/0041747 A1* | 2/2015 | Kim ..................... H01L 45/144 257/2 |
| 2015/0280118 A1 | 10/2015 | Lee et al. |
| 2015/0349255 A1* | 12/2015 | Pellizzer ............. H01L 45/1233 257/4 |
| 2016/0181321 A1* | 6/2016 | Jung ...................... H01L 45/06 257/4 |
| 2016/0233271 A1* | 8/2016 | Pellizzer ............. H01L 27/2463 |

* cited by examiner

FIG. 2
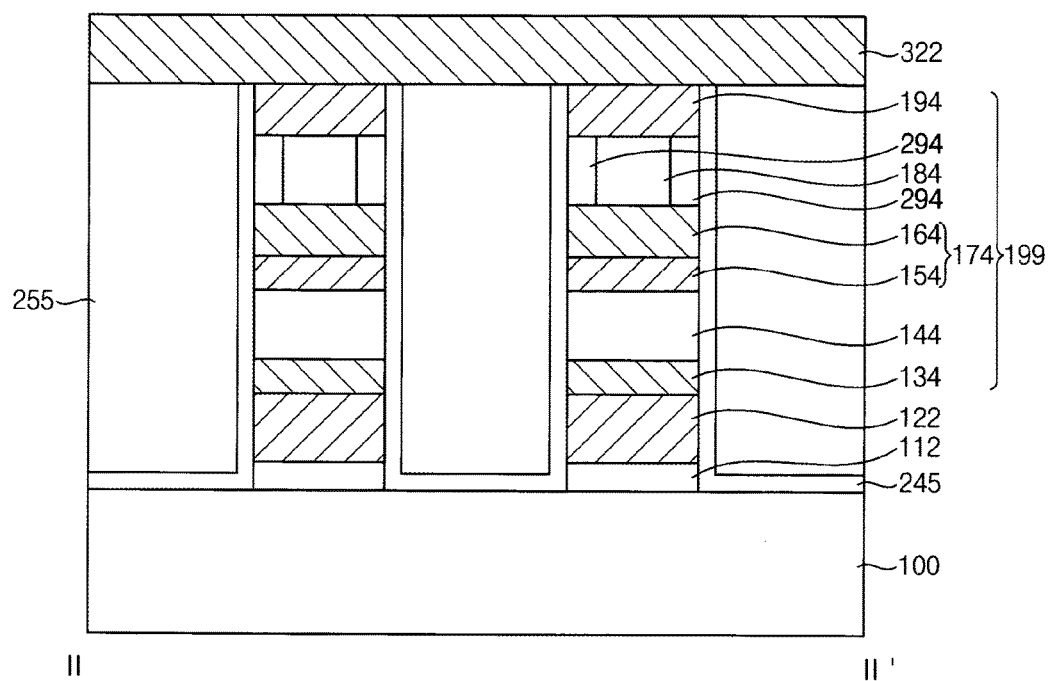
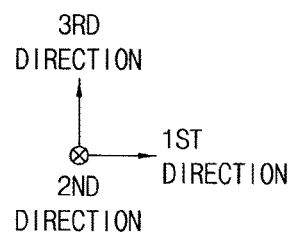

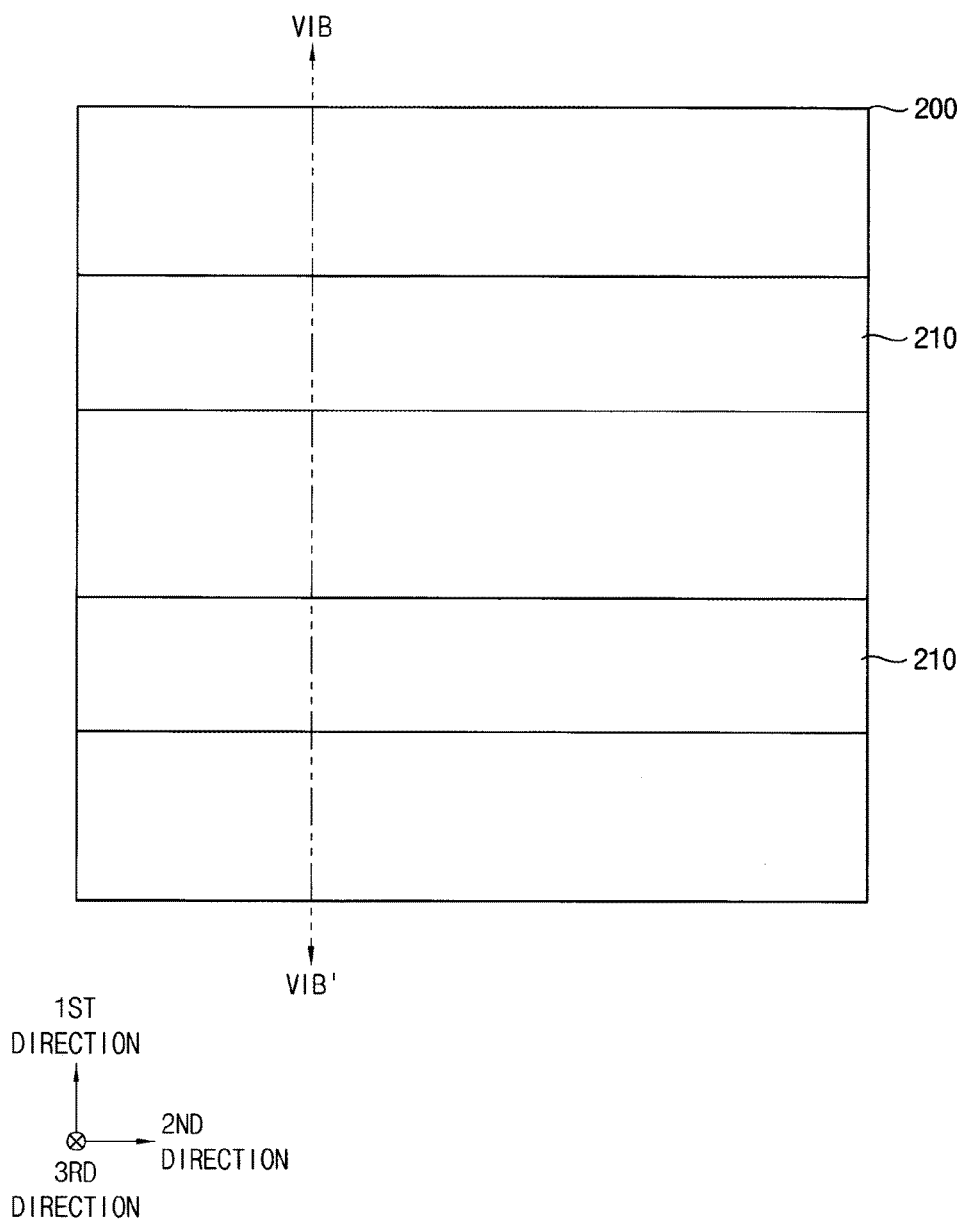

FIG. 11
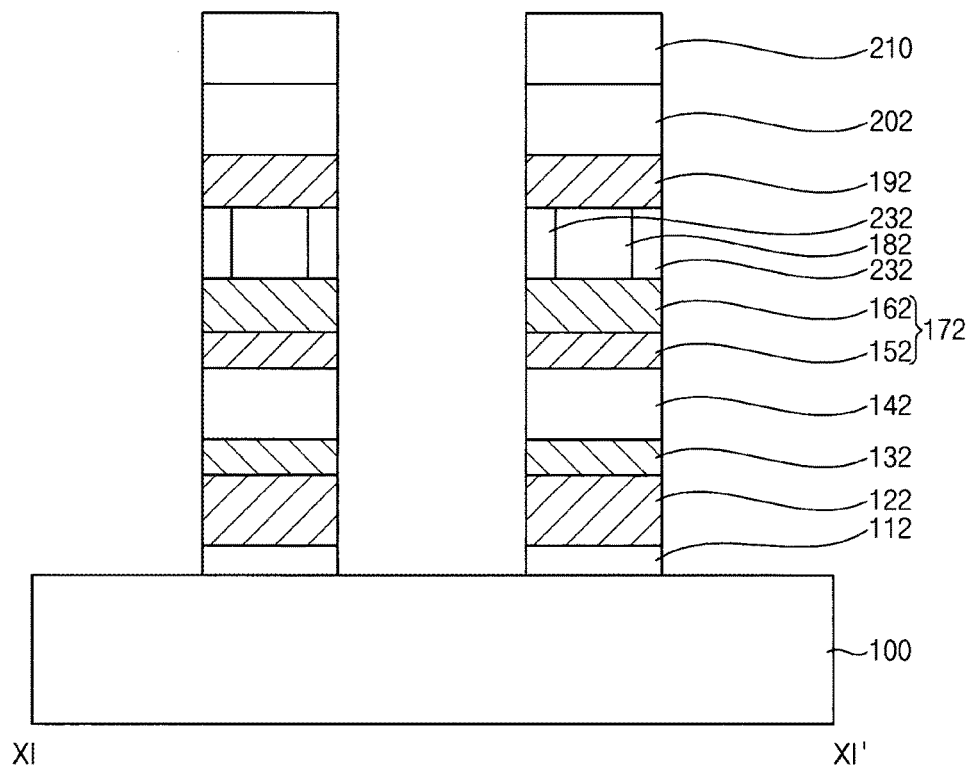
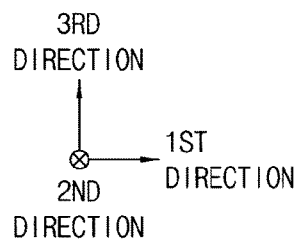

FIG. 14
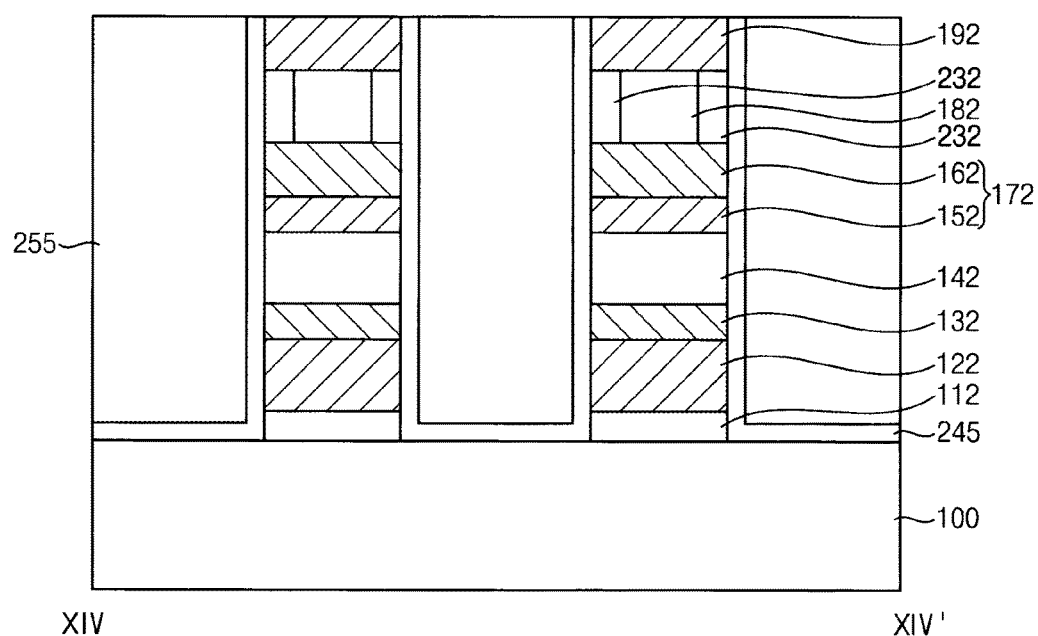
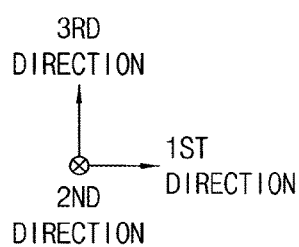

FIG. 20
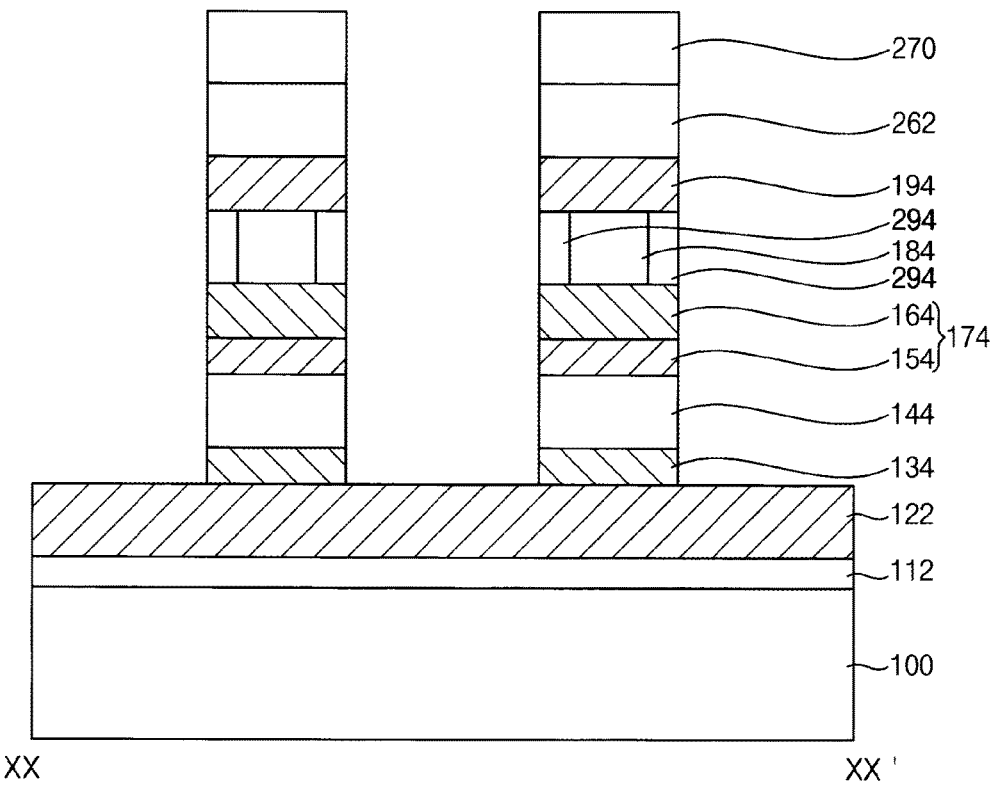
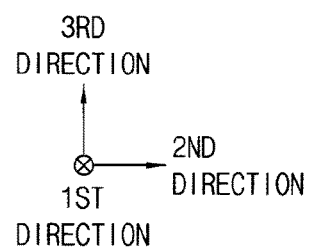

FIG. 25
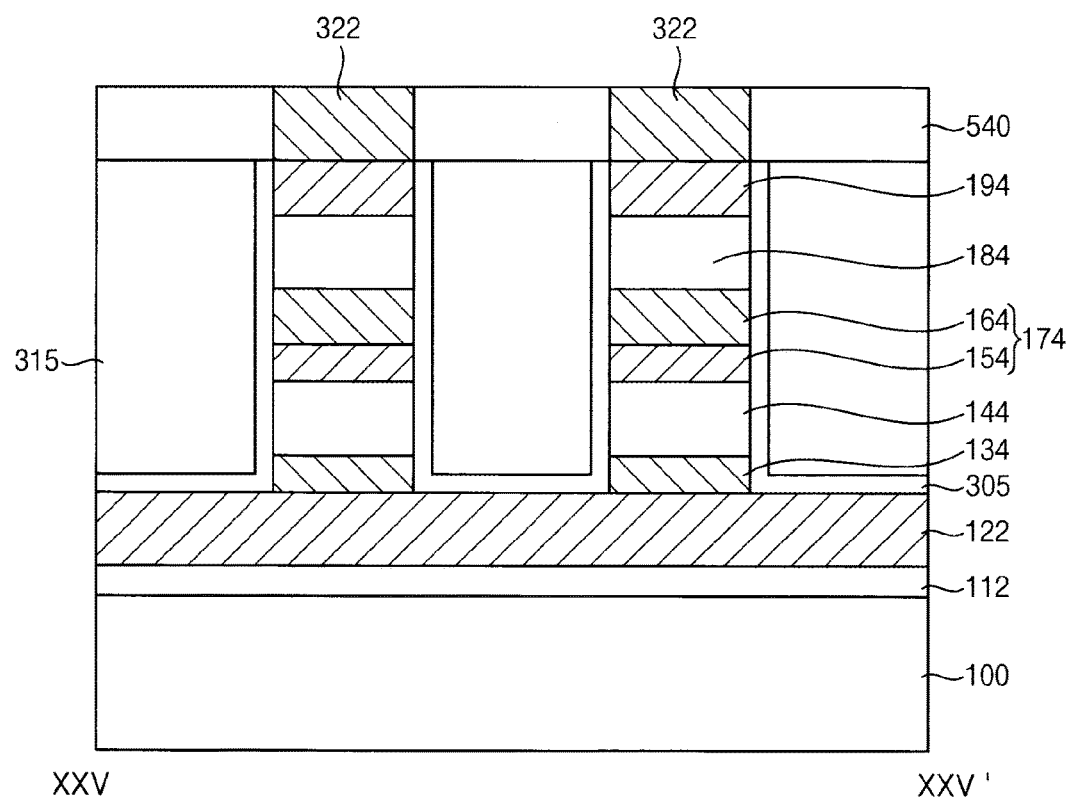
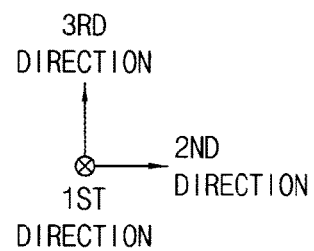

FIG. 36
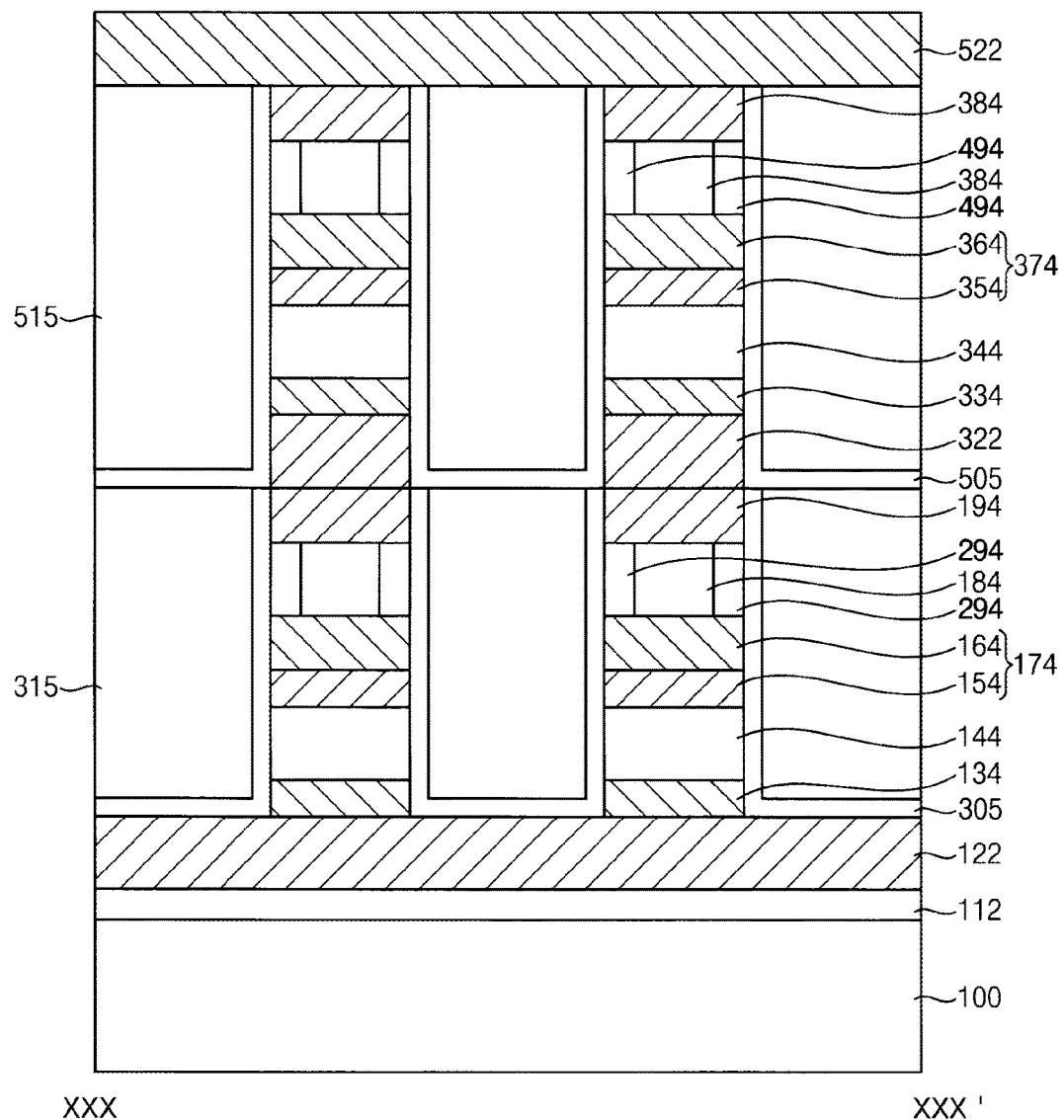
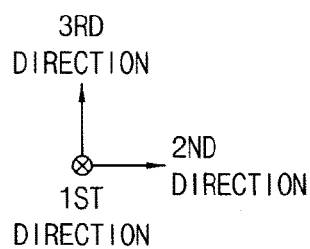

FIG. 38
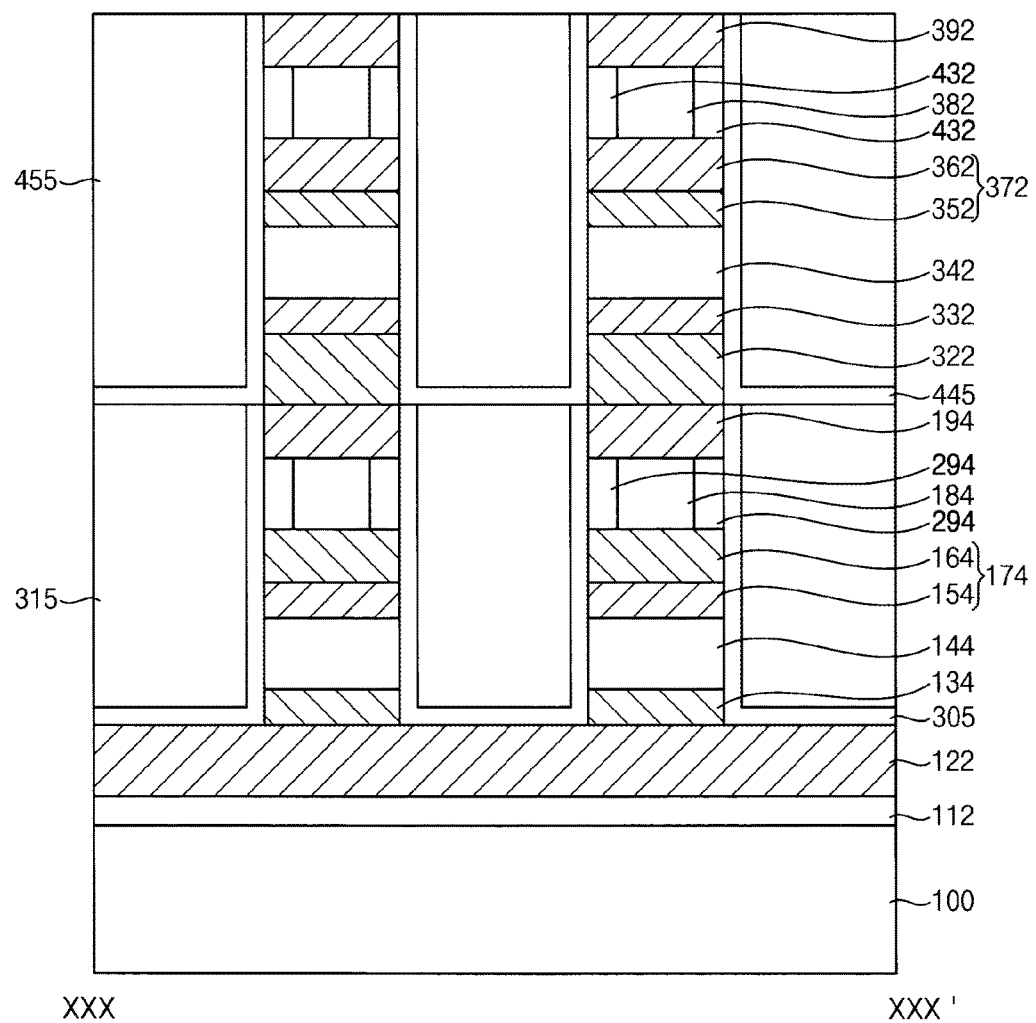
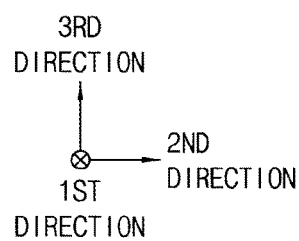

VARIABLE RESISTANCE MEMORY DEVICES

CROSS-REFERENCE TO RELATED APPLICATION

This application claims priority under 35 USC § 119 to Korean Patent Application No. 10-2016-0038071, filed on Mar. 30, 2016 in the Korean Intellectual Property Office (KIPO), the contents of which are herein incorporated by reference in their entirety.

BACKGROUND

1. Field

Example embodiments relate to variable resistance memory devices and methods of manufacturing the same.

2. Description of the Related Art

In some cases, manufacturing a variable resistance memory device having a cross-point array structure includes sequentially depositing a plurality of layers on a substrate. Such manufacturing may include initially etching the layers using a first etching mask extending in a first direction and subsequently etching the layers using a second etching mask extending in a second direction to form a plurality of memory cell structures spaced apart from each other. Thus, a plurality of layers including different materials may be etched by the same etching process. In some cases, manufacturing a variable memory device according to such an etching process may result in one or more layers being damaged, based on the use of various etching gasses during the process.

SUMMARY

Some example embodiments provide a variable resistance memory device.

Some example embodiments provide a method of manufacturing a variable resistance memory device.

According to some example embodiments, a variable resistance memory device may include a pattern of first conductive lines extending in a first direction on a substrate, a pattern of second conductive lines extending in a second direction substantially orthogonal to the first direction on the first conductive lines, and a memory structure between the first and second conductive lines. Each of the first conductive lines may extend in the second direction, the first and second directions substantially parallel to an upper surface of the substrate. Each of the second conductive lines may extend in the first direction. The memory structure may vertically overlap each of at least one first conductive line and at least one second conductive line. The memory structure may extend in a third direction substantially orthogonal to the first direction and the second direction, the third direction substantially orthogonal to the upper surface of the substrate. The memory structure may include an electrode structure, an insulation pattern on a central upper surface of the electrode structure, and a variable resistance pattern on an edge upper surface of the electrode structure, the variable resistance pattern at least partially covering a sidewall of the insulation pattern.

According to some example embodiments, a variable resistance memory device may include a pattern of first conductive lines extending in a first direction on a substrate, a pattern of second conductive lines extending in a second direction substantially orthogonal to the first direction on the first conductive lines, and a memory structure between the first and second conductive lines. Each of the first conductive lines may extend in the second direction, and the first and second directions substantially parallel to an upper surface of the substrate. Each of the second conductive lines may extend in the first direction. The memory structure may vertically overlap each of at least one first conductive line and at least one second conductive line in a third direction substantially orthogonal to the upper surface of the substrate. The memory structure may include an electrode structure, an insulation pattern contacting a central lower surface of the electrode structure, and a variable resistance pattern contacting an edge lower surface of the electrode structure, the variable resistance pattern at least partially covering a sidewall of the insulation pattern.

According to some example embodiments, a variable resistance memory device may include a memory structure including a first electrode on a substrate, a selection pattern on the first electrode, a second electrode on the selection pattern, an insulation pattern on a central upper surface of the second electrode, a variable resistance pattern covering at least a portion of a sidewall of the insulation pattern on an edge upper surface of the second electrode, and a third electrode on the insulation pattern and the variable resistance pattern.

According to some example embodiments, there is provided a method of manufacturing a variable resistance memory device. In the method, a first electrode layer structure, an insulation layer and a second electrode layer may be sequentially formed on a substrate. The second electrode layer, the insulation layer and the first electrode layer structure may be patterned to form a second electrode, an insulation pattern and a first electrode structure, respectively. An edge portion of the insulation pattern may be removed to form a gap between the first electrode structure and the second electrode. A variable resistance pattern may be formed in the gap.

According to some example embodiments, there is provided a method of manufacturing a variable resistance memory device. In the method, a first electrode layer, an insulation layer and a second electrode layer may be sequentially formed on a substrate. The second electrode layer, the insulation layer and the first electrode layer may be patterned using a first etching mask to form a preliminary second electrode, a preliminary insulation pattern and a preliminary first electrode, respectively. The first etching mask may extend in a second direction substantially parallel to an upper surface of the substrate. Opposite edge portions of the preliminary insulation pattern in a first direction may be removed to form first gaps. The first direction may be substantially parallel to the upper surface of the substrate and substantially orthogonal to the second direction. A preliminary first variable resistance pattern may be formed in each of the first gaps. The preliminary second electrode, the preliminary insulation pattern, the preliminary first variable resistance pattern and the preliminary first electrode may be patterned using a second etching mask to form a second electrode, an insulation pattern, a first variable resistance pattern and a first electrode, respectively. The second etching mask may extend in the first direction. Opposite edge portions of the insulation pattern in the second direction may be removed to form second gaps. A second variable resistance pattern may be formed in each of the second gaps.

In the method of manufacturing the variable resistance memory device according to some example embodiments, the insulation layer may be formed between the second electrode layer structure and the third electrode layer and partially removed to form the gap, and the variable resistance pattern may be formed to fill the gap. Thus, the variable resistance pattern may not be etched together with other layers, and may not be exposed various etching gases and damaged.

The variable resistance pattern may fill the gap that may be formed by partially removing the insulation layer, and thus may have a desired size and/or area by controlling the removal process. Thus, the contact area with the underlying second electrode structure may be easily controlled, and the consumption current may be reduced.

According to some example embodiments, a memory structure may include an electrode structure, an insulation pattern on a central upper surface of the electrode structure, and a variable resistance pattern on an edge upper surface of the electrode structure, the variable resistance pattern at least partially covering a sidewall of the insulation pattern.

BRIEF DESCRIPTION OF THE DRAWINGS

Example embodiments will be more clearly understood from the following detailed description taken in conjunction with the accompanying drawings. FIGS. 1 to 38 represent non-limiting, example embodiments as described herein.

FIG. 1 is a plan view illustrating a variable resistance memory device according to some example embodiments;

FIG. 2 is a cross-sectional view along line II-II' of FIG. 1;

FIG. 3 is a cross-sectional view along line III-III' of FIG. 1;

FIG. 4 is a plan view illustrating a stage of a method of manufacturing a variable resistance memory device according to some example embodiments;

FIG. 5 is a cross-sectional view illustrating a stage of a method of manufacturing a variable resistance memory device along line V-V' of FIG. 4;

FIG. 6A is a plan view illustrating a stage of a method of manufacturing a variable resistance memory device according to some example embodiments;

FIG. 7 is a plan view illustrating a stage of a method of manufacturing a variable resistance memory device according to some example embodiments;

FIG. 8 is a cross-sectional view along line VIII-VIII' of FIG. 7;

FIG. 10 is a plan view illustrating a stage of a method of manufacturing a variable resistance memory device according to some example embodiments;

FIG. 11 is a cross-sectional view along line XI-XI' of FIG. 10;

FIG. 13 is a plan view illustrating a stage of a method of manufacturing a variable resistance memory device according to some example embodiments;

FIG. 14 is a cross-sectional view along line XIV-XIV' of FIG. 13;

FIG. 15 is a plan view illustrating a stage of a method of manufacturing a variable resistance memory device according to some example embodiments;

FIG. 16 is a cross-sectional view along line XVI-XVI' of FIG. 15;

FIG. 17 is a plan view illustrating a stage of a method of manufacturing a variable resistance memory device according to some example embodiments;

FIG. 18 is a cross-sectional view along line XVIII-XVIII' of FIG. 17;

FIG. 19 is a plan view illustrating a stage of a method of manufacturing a variable resistance memory device according to some example embodiments;

FIG. 20 is a cross-sectional view along line XX-XX' of FIG. 19;

FIG. 21 is a plan view illustrating a stage of a method of manufacturing a variable resistance memory device according to some example embodiments;

FIG. 22 is a cross-sectional view along line XXII-XXII' of FIG. 21;

FIG. 23 is a plan view illustrating a variable resistance memory device according to some example embodiments;

FIG. 24 is a cross-sectional view along line XXIV-XXIV' of FIG. 23;

FIG. 25 is a cross-sectional view along line XXV-XXV' of FIG. 23;

FIG. 26 is a plan view illustrating a variable resistance memory device according to some example embodiments;

FIG. 27 is a cross-sectional view along line XXVII-XXVII' of FIG. 26;

FIG. 28 is a plan view illustrating a variable resistance memory device according to some example embodiments;

FIG. 29 is a cross-sectional view along line XXIX-XXIX' of FIG. 28;

FIG. 30 is a cross-sectional view along line XXX-XXX' of FIG. 28;

FIG. 31 is a cross-sectional view illustrating a variable resistance memory device according to some example embodiments;

FIG. 32 is a cross-sectional view illustrating a variable resistance memory device according to some example embodiments;

FIG. 33 is a cross-sectional view illustrating a variable resistance memory device according to some example embodiments;

FIG. 34 is a cross-sectional view illustrating a variable resistance memory device according to some example embodiments;

FIG. 35 is a cross-sectional view illustrating a variable resistance memory device according to some example embodiments;

FIG. 36 is a cross-sectional view illustrating a variable resistance memory device according to some example embodiments;

FIG. 37 is a cross-sectional view illustrating a variable resistance memory device according to some example embodiments; and FIG. 38 is a cross-sectional view illustrating a variable resistance memory device according to some example embodiments.

DESCRIPTION OF EMBODIMENTS

Figure 1:
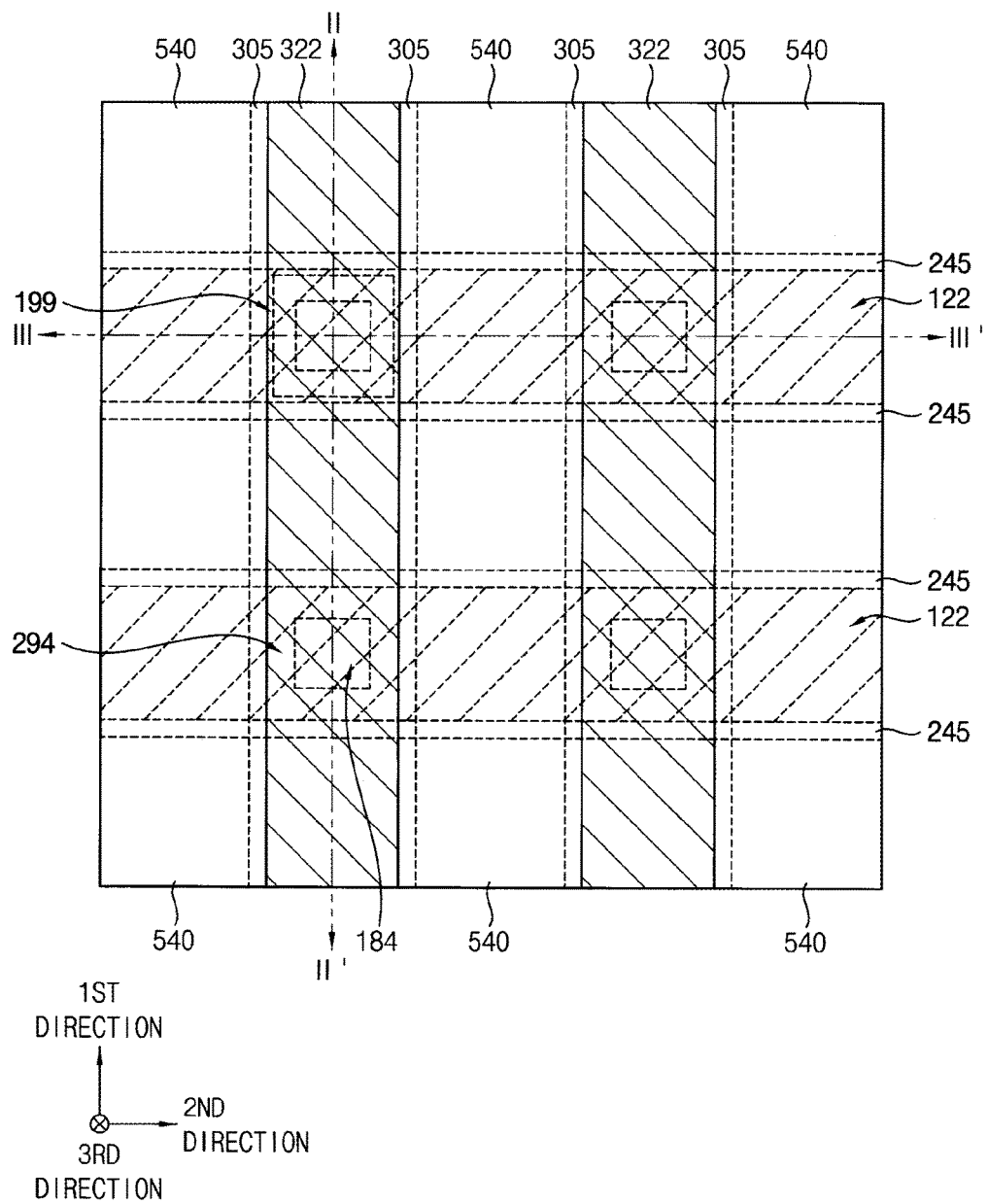
Figure 3:
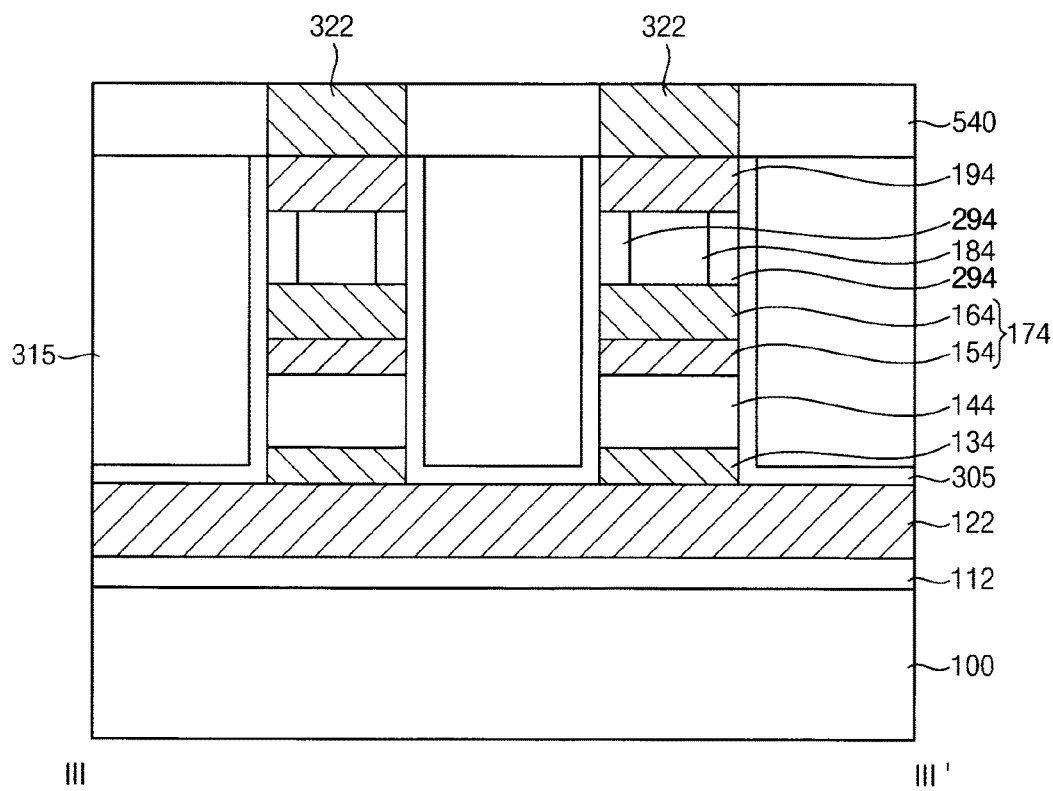

FIG. 1 is a plan view illustrating a variable resistance memory device in accordance with some example embodiments, and FIGS. 2 and 3 are cross-sectional views illustrating the variable resistance memory device of FIG. 1. FIG. 2 is a cross-sectional view taken along lines II-II' in FIG. 1, and FIG. 3 is a cross-sectional view taken along a line III-III' in FIG. 1.

Hereinafter, two directions substantially parallel (e.g., parallel within manufacturing tolerances and/or material tolerances) to an upper surface of a substrate and crossing each other may be defined as first and second directions, respectively, and a direction substantially orthogonal (e.g., orthogonal within manufacturing tolerances and/or material tolerances) to the upper surface of the substrate may be defined as a third direction. In some example embodiments, the first and second directions may cross each other at a right angle so as to be substantially orthogonal to each other.

Referring to FIGS. 1 to 3, the variable resistance memory device may include a first conductive line 122, a second conductive line 322, and a first memory structure 199.

The variable resistance memory device may further include first and second capping patterns 245 and 305, and first to fourth insulating interlayer patterns 112, 255, 315 and 540.

The substrate 100 may include a semiconductor material, e.g., silicon, germanium, silicon-germanium, etc., or III-V semiconductor compounds, e.g., GaP, GaAs, GaSb, etc. In some example embodiments, the substrate 100 may be a silicon-on-insulator (SOI) substrate, or a germanium-on-insulator (GOI) substrate.

Various elements, e.g., gate structures, impurity layers, contact plugs, wirings, etc. may be formed on the substrate 100, and may be covered by the first insulating interlayer pattern 112. The first insulating interlayer pattern 112 may include an insulating material, e.g., silicon oxide, silicon nitride, silicon oxynitride, etc.

The first conductive line 122 may be formed on the first insulating interlayer pattern 112. In some example embodiments, the first conductive line 122 may extend in the second direction, and a plurality ("pattern") of first conductive lines 122 may be formed to be spaced apart from each other in the first direction (e.g., the pattern of first conductive lines 122 extends in the first direction). The second conductive line 322 may be disposed over the first conductive line 122 and spaced apart from the first conductive line 122. The second conductive line 322 may extend in the first direction, and a plurality ("pattern") of second conductive lines 322 may be spaced apart from each other in the second direction (e.g., the pattern of second conductive lines 322 extends in the second direction).

In some example embodiments, the first and second conductive lines 122 and 322 may serve as a word line and a bit line, respectively, of the variable resistance memory device. In some example embodiments, the first and second conductive lines 122 and 322 may serve as a bit line and a word line, respectively, of the variable resistance memory device.

Each of the first and second conductive lines 122 and 322 may include a metal, e.g., tungsten, platinum, palladium, rhodium, ruthenium, iridium, copper, aluminum, titanium, tantalum, etc., or a metal nitride thereof.

In some example embodiments, the first conductive line 122 may include a first metal pattern and a first barrier pattern covering a sidewall and a lower surface of the first metal pattern. The second conductive line 322 may include a second metal pattern and a second barrier pattern covering a sidewall and a lower surface of the second metal pattern. Each of the first and second metal patterns may include a metal, and each of the first and second barrier patterns may include a metal nitride, e.g., titanium nitride, tantalum nitride, tungsten nitride, etc.

The first memory structure 199 (also referred to herein as a first memory 199 and/or a first memory element 199) may be formed between the first and second conductive lines 122 and 322, specifically, at a region where the first and second conductive lines 122 and 322 overlap each other in the third direction. For example, a memory structure 199 may vertically overlap each of at least one first conductive line 122 and at least one second conductive line 322.

The first memory structure 199 may include a first electrode 134, a first selection pattern 144, a second electrode structure 174, an insulation pattern 184, a variable resistance pattern 294, and a third electrode 194. The first electrode 134, the first selection pattern 144, the second electrode structure 174, the insulation pattern 184, and the third electrode 194 may be sequentially stacked on each of the first conductive lines 122, and the variable resistance pattern 294 may be formed between the second electrode structure 174 and the third electrode 194 and cover a sidewall of the insulation pattern 184, such that the insulation pattern 184 is on a central upper surface of the second electrode structure 174 and the variable resistance pattern 294 is on one or more edge upper surfaces of the second electrode structure 174.

Each of the first and third electrodes 134 and 194 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

In some example embodiments, the first electrode 134 and/or the third electrode 194 may not be formed.

In some example embodiments, the first selection pattern 144 may include an ovonic threshold switch (OTS) material that may serve as a switching element by the resistance difference due to the temperature difference in an amorphous state. That is, the selection pattern 144 may remain in the amorphous state in a temperature range greater than that of the variable resistance pattern 294, however, may have a large resistance difference even in the amorphous state.

The OTS material may include, e.g., germanium, silicon, arsenic and/or tellurium, and may further include selenium and/or sulfur.

The OTS material may include, e.g., AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

In some example embodiments, the first selection pattern 144 may include a polysilicon layer doped with n-type impurities and a polysilicon layer doped with p-type impurities sequentially stacked, e.g., a diode.

The second electrode structure 174 may include first and second patterns 154 and 164 sequentially stacked. The first pattern 154 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc. The first pattern 154 may be also referred to as a second electrode.

The second pattern 164 may heat the variable resistance pattern 294, and the resistance of the variable resistance pattern 294 may be changed. The second pattern 164 may be also referred to as a heater. In some example embodiments, the second pattern 164 may include carbon, metal containing carbon, or metal nitride containing carbon. For example, the second pattern 164 may include carbon, carbonitride, titanium carbonitride and/or tantalum carbonitride.

The insulation pattern 184 may contact a central upper surface of the second electrode structure 174, and thus may also contact a central lower surface of the third electrode 194. The insulation pattern 184 may include an oxide, e.g., silicon oxide.

The variable resistance pattern 294 may contact an edge upper surface of the second electrode structure 174, and thus may also contact an edge lower surface of the third electrode 194. In some example embodiments, the variable resistance pattern 294 may have a ring shape surrounding a sidewall of the insulation pattern 184. The variable resistance pattern 294 may have, e.g., a rectangular ring shape, a circular ring shape, or an elliptical ring shape.

In some example embodiments, the variable resistance pattern 294 may include a material whose resistance may be changed according to the phase change thereof, and in this case, the variable resistance memory device may be a phase-change random access memory (PRAM) device.

In some example embodiments, the variable resistance pattern 294 may include a chalcogenide material containing germanium, antimony and/or tellurium. In some example embodiments, the variable resistance pattern 294 may include a super lattice having a germanium-tellurium layer and an antimony-tellurium layer alternately stacked. In some example embodiments, the variable resistance pattern 294 may include IST containing indium-antimony-tellurium or BST containing bismuth-antimony-tellurium.

In some example embodiments, the variable resistance pattern 294 may include a perovskite-based material or a transition metal, and in this case, the variable resistance memory device may be a resistive random access memory (ReRAM) device.

The perovskite-based material may include, e.g., STO (SrTiO$_3$), BTO (BaTiO$_3$), PCMO (Pr$_{1-x}$Ca$_x$MnO$_3$) or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx). These may be used alone or in combination.

In some example embodiments, the variable resistance pattern 294 may include a material whose resistance may be changed by a magnetic field or a spin transfer torque (STT), and in this case, the variable resistance memory device may be a magnetic random access memory (MRAM) device.

For example, the variable resistance pattern 294 may include a ferromagnetic material, e.g., iron (Fe), nickel (Ni), cobalt (Co), dysprosium (Dy), gadolinium (Gd) or the like.

In some example embodiments, a plurality of first memory structures 199 may be formed in each of the first and second directions, and may be disposed in a grid pattern in a plan view.

In a plan view, the second electrode structure 174 and the third electrode 194 may have substantially the same area (e.g., having the same area within manufacturing tolerances and/or material tolerances), while the variable resistance pattern 294 may have an area less than that of the second electrode structure 174 and the third electrode 194. Thus, the second pattern 164 of the second electrode structure 174, i.e., the heater may have a reduced area contacting the variable resistance pattern 294 so as to reduce the consumption current.

The first capping pattern 245 may cover opposite sidewalls of the first memory structure 199 in the first direction and an upper surface of the substrate 100. The second capping pattern 305 may cover upper portions of opposite sidewalls of the first memory structure 199 in the first direction, and upper surfaces of the first conductive line 122, the first capping pattern 245 and the second insulating interlayer pattern 255. The first and second capping patterns 245 and 305 may include an insulating material, e.g., silicon nitride, silicon oxide, etc.

The second insulating interlayer pattern 255 may be formed on the first capping pattern 245 between the first memory structures 199 spaced apart from each other in the first direction, and the third insulating interlayer pattern 315 may be formed on the second capping pattern 305 between the first memory structures 199 spaced apart from each other in the second direction. The fourth insulating interlayer pattern 540 may be formed on the third insulating interlayer pattern 315 and the second capping pattern 305. The fourth insulating interlayer pattern 540 may extend in the first direction, and may contact opposite sidewalls of the second conductive line 322.

The second to fourth insulating interlayer patterns 255, 315 and 540 may include an insulating material, e.g., silicon oxide, silicon nitride, silicon oxynitride, etc.

The variable resistance memory device may include the insulation pattern 184 between the second electrode structure 174 and the third electrode 194, and the variable resistance pattern 294 may surround the sidewall of the insulation pattern 184 between the second electrode structure 174 and the third electrode 194. Thus, the variable resistance pattern 294 may have an area less than those of the second electrode structure 174 and the third electrode 194, and the variable resistance memory device may have a reduced consumption current.

Figure 4:
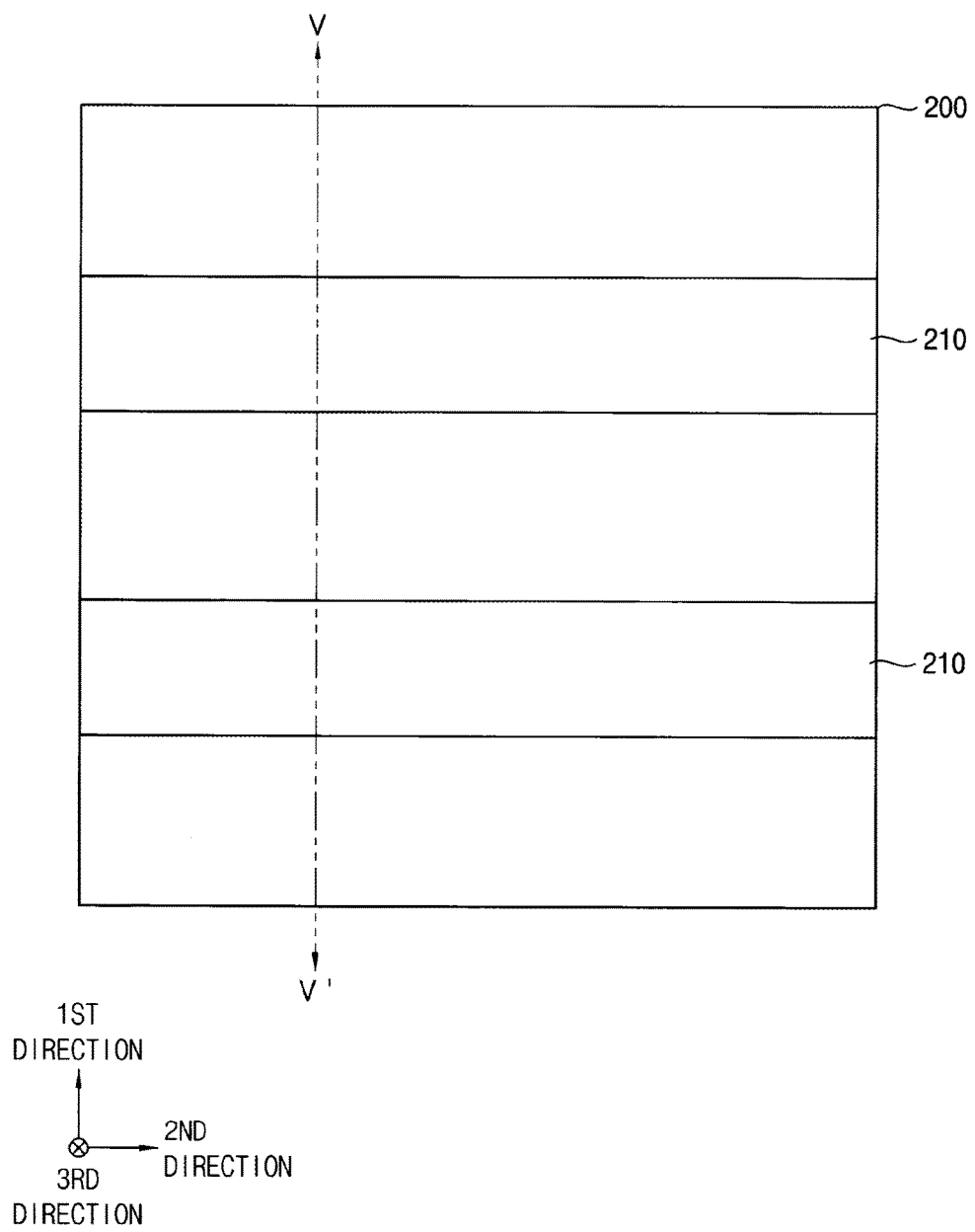
Figure 5:
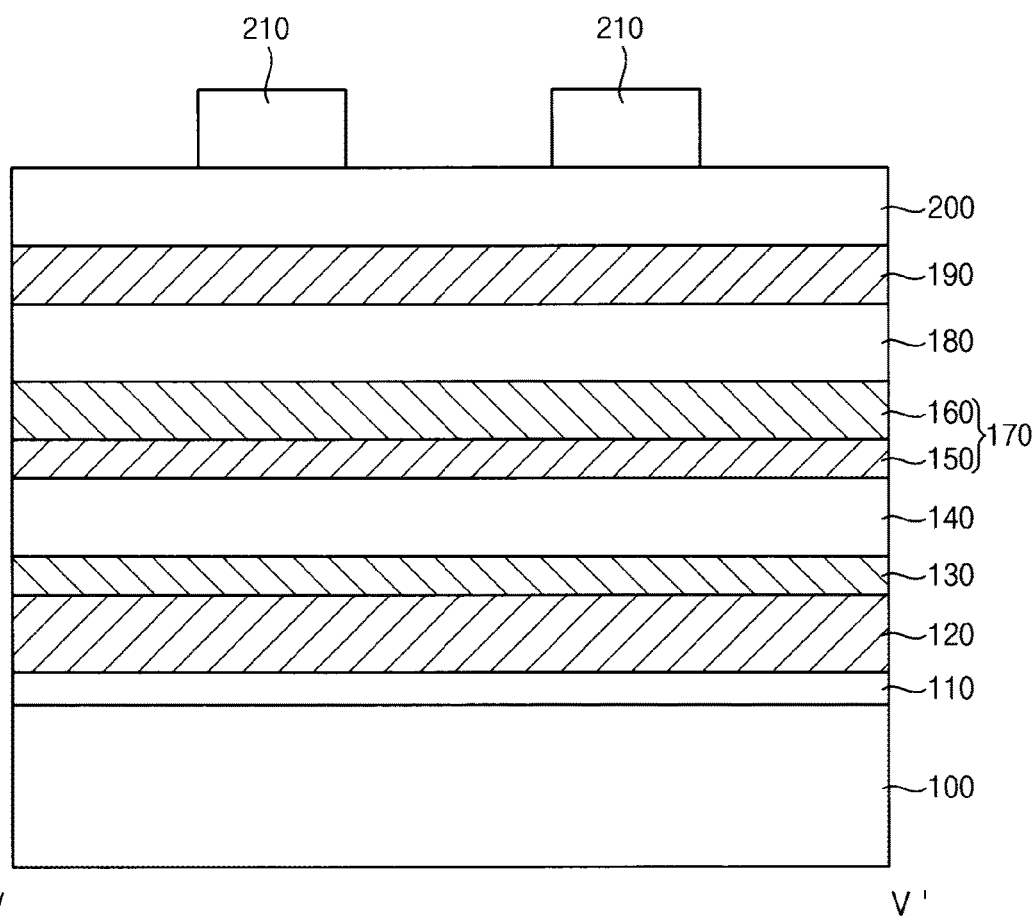
Figure 6B:
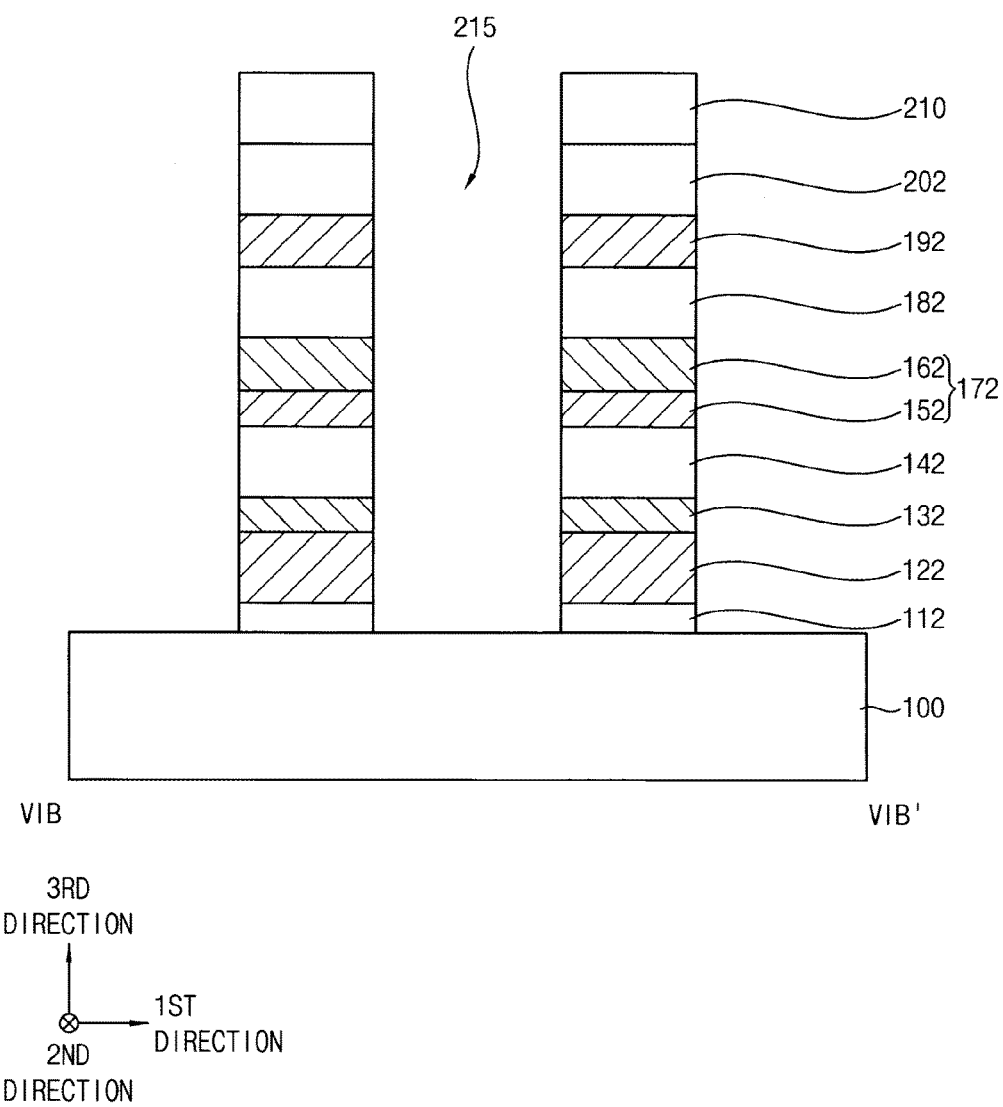
FIG. 6B is a cross-sectional view along line VIB-VIB' of FIG. 6A.
Figure 7:
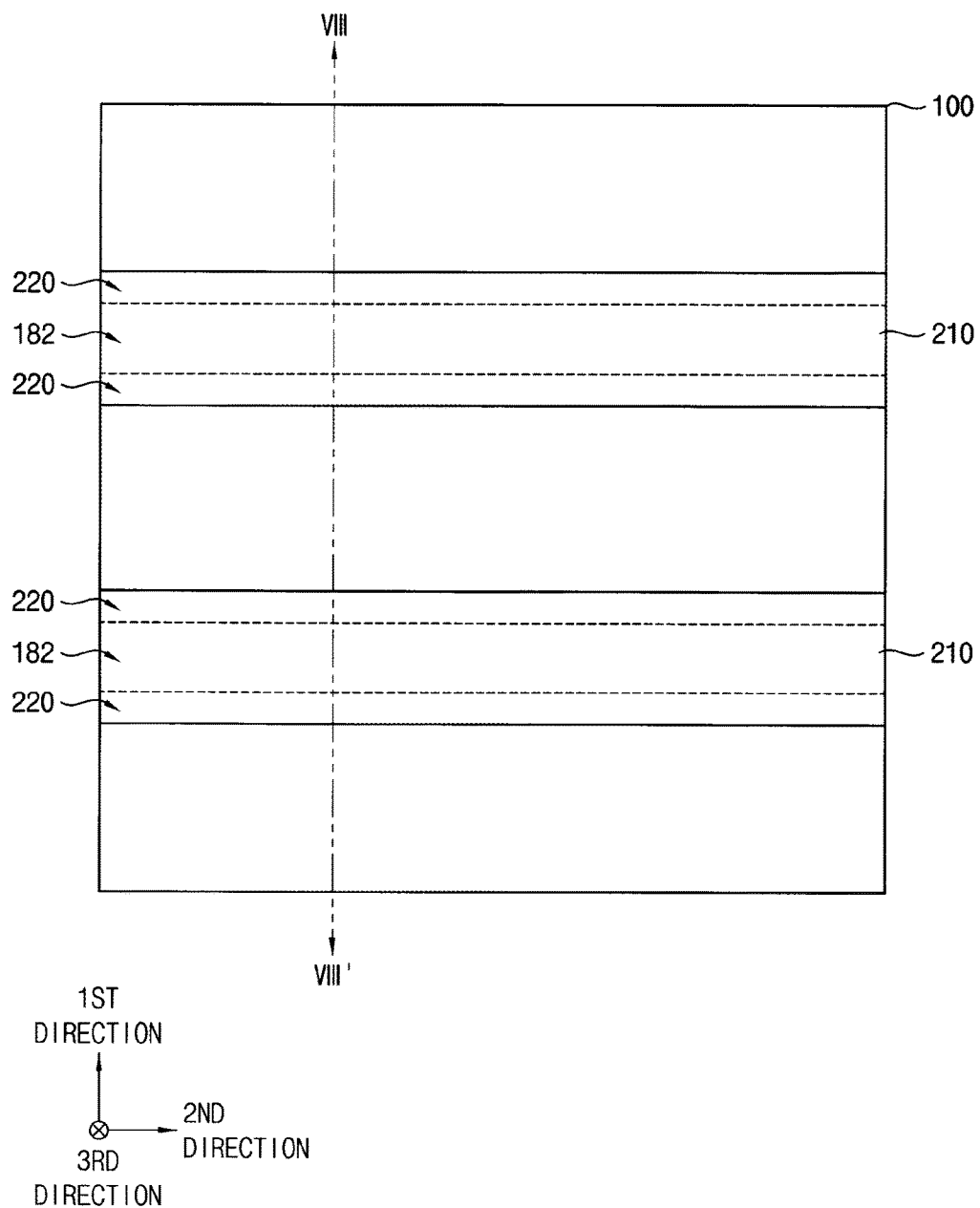
Figure 8:
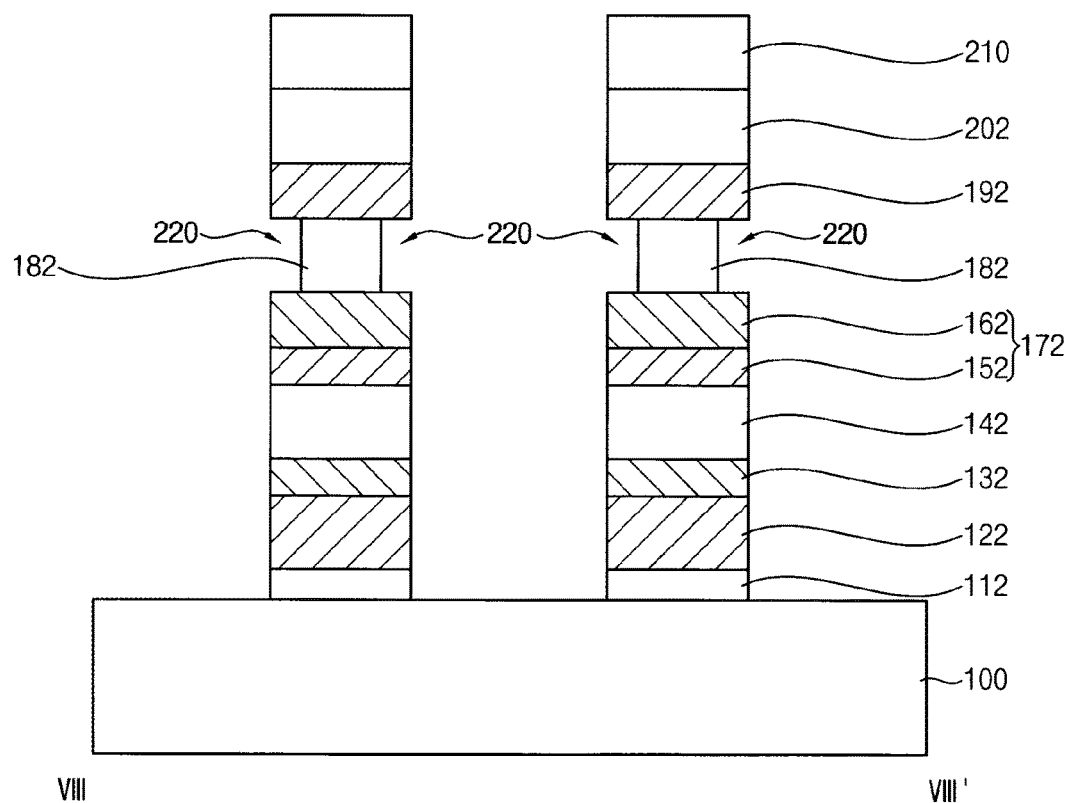
Figure 9A:
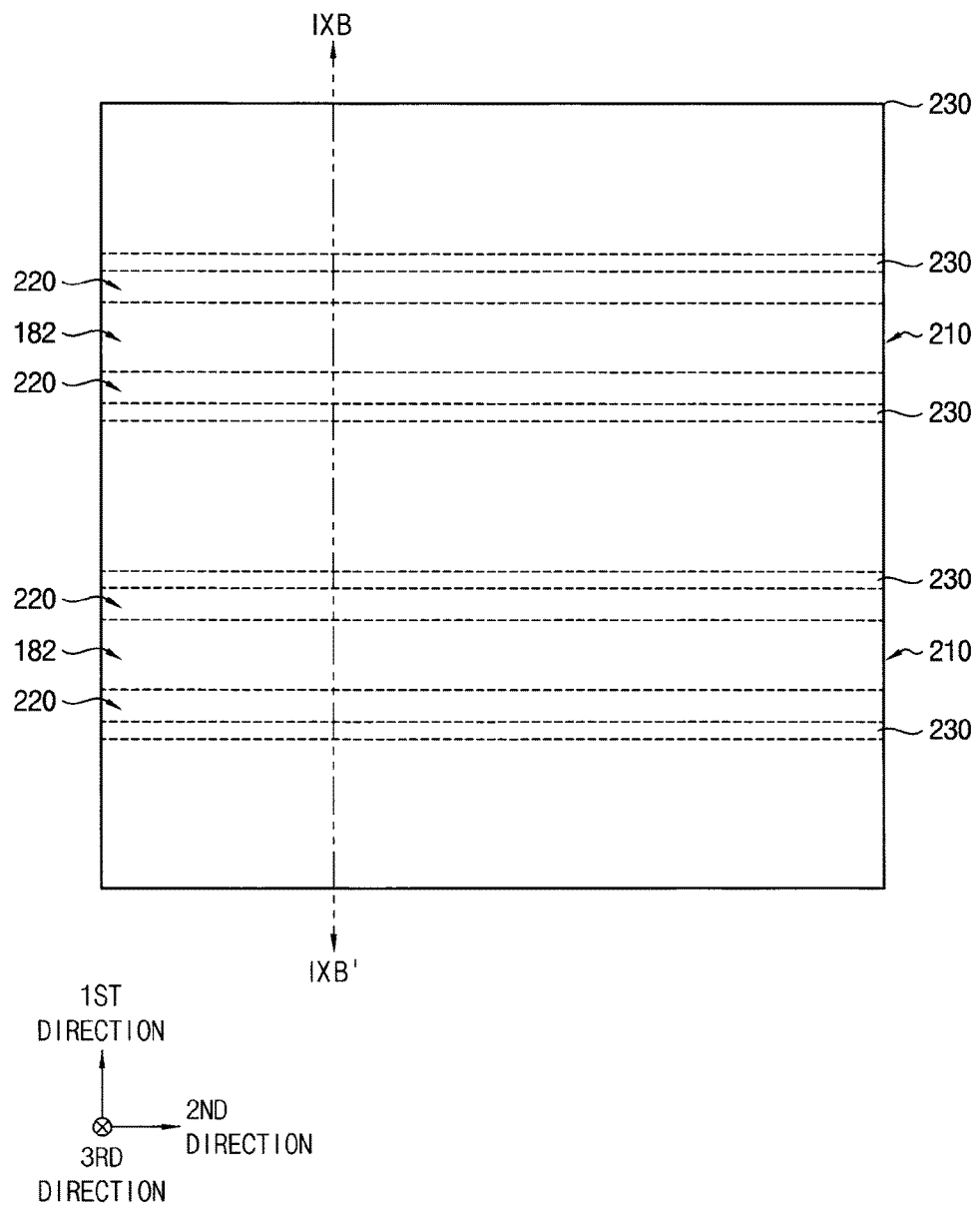
FIG. 9A is a plan view illustrating a stage of a method of manufacturing a variable resistance memory device according to some example embodiments.
Figure 9B:
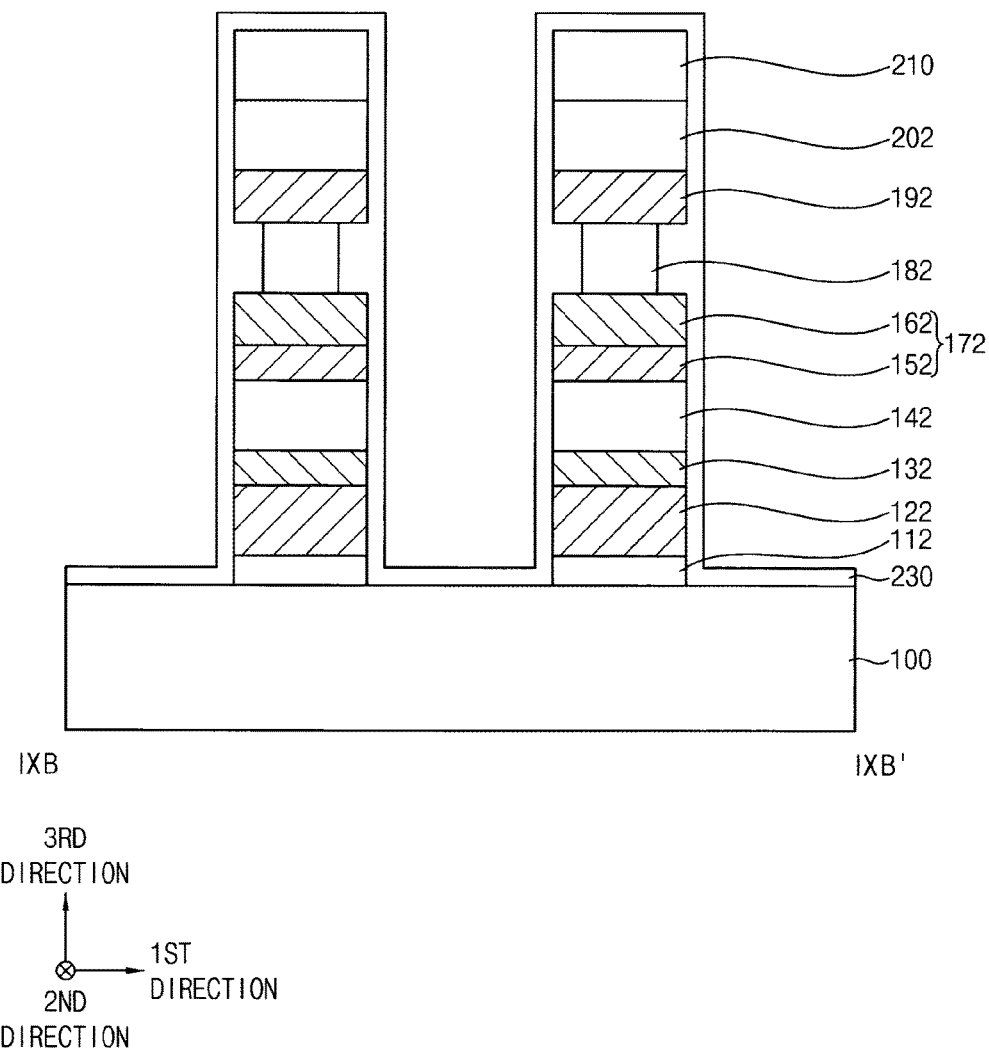
FIG. 9B is a cross-sectional view along line IXB-IXB' of FIG. 9A.
Figure 10:
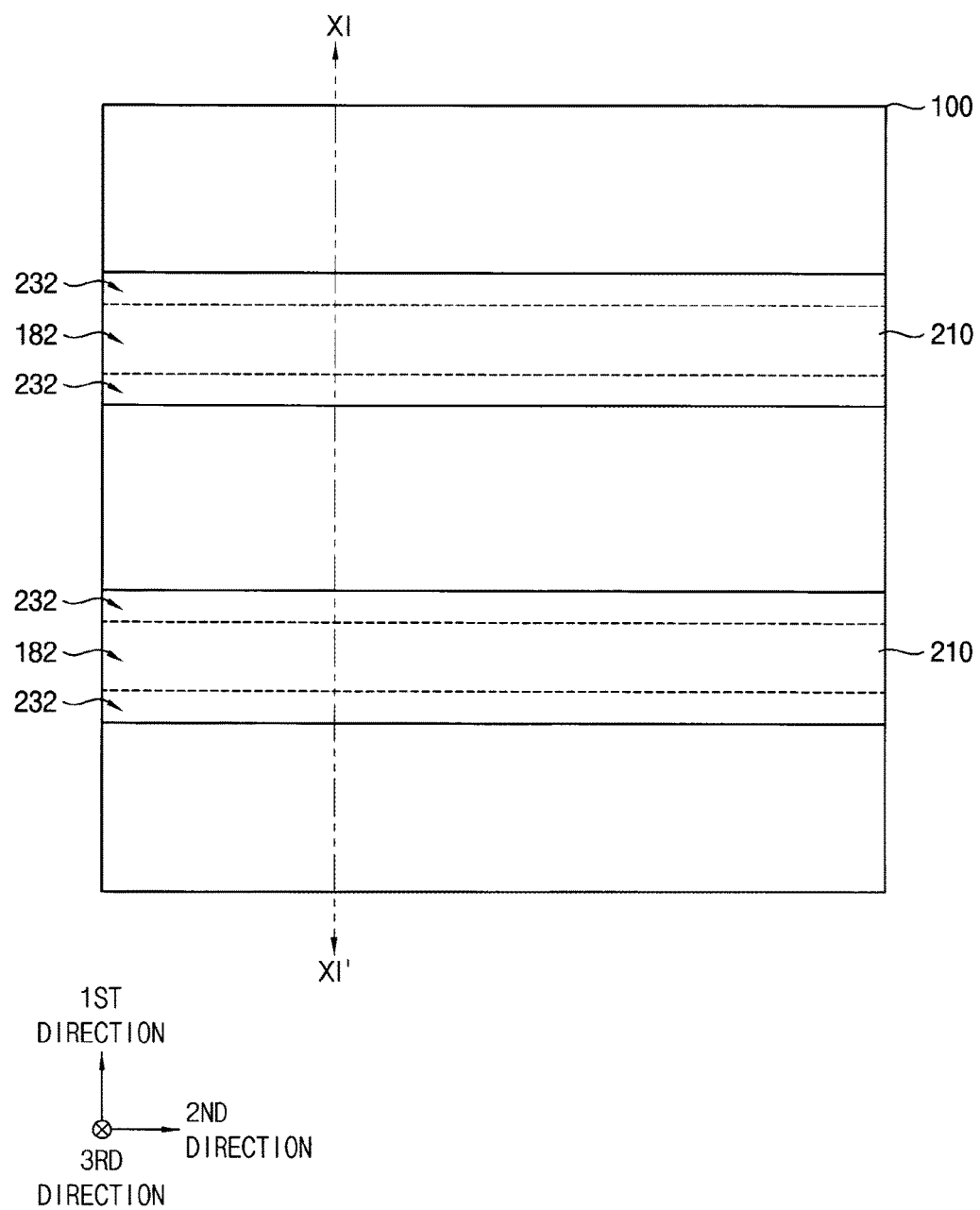
Figure 12A:
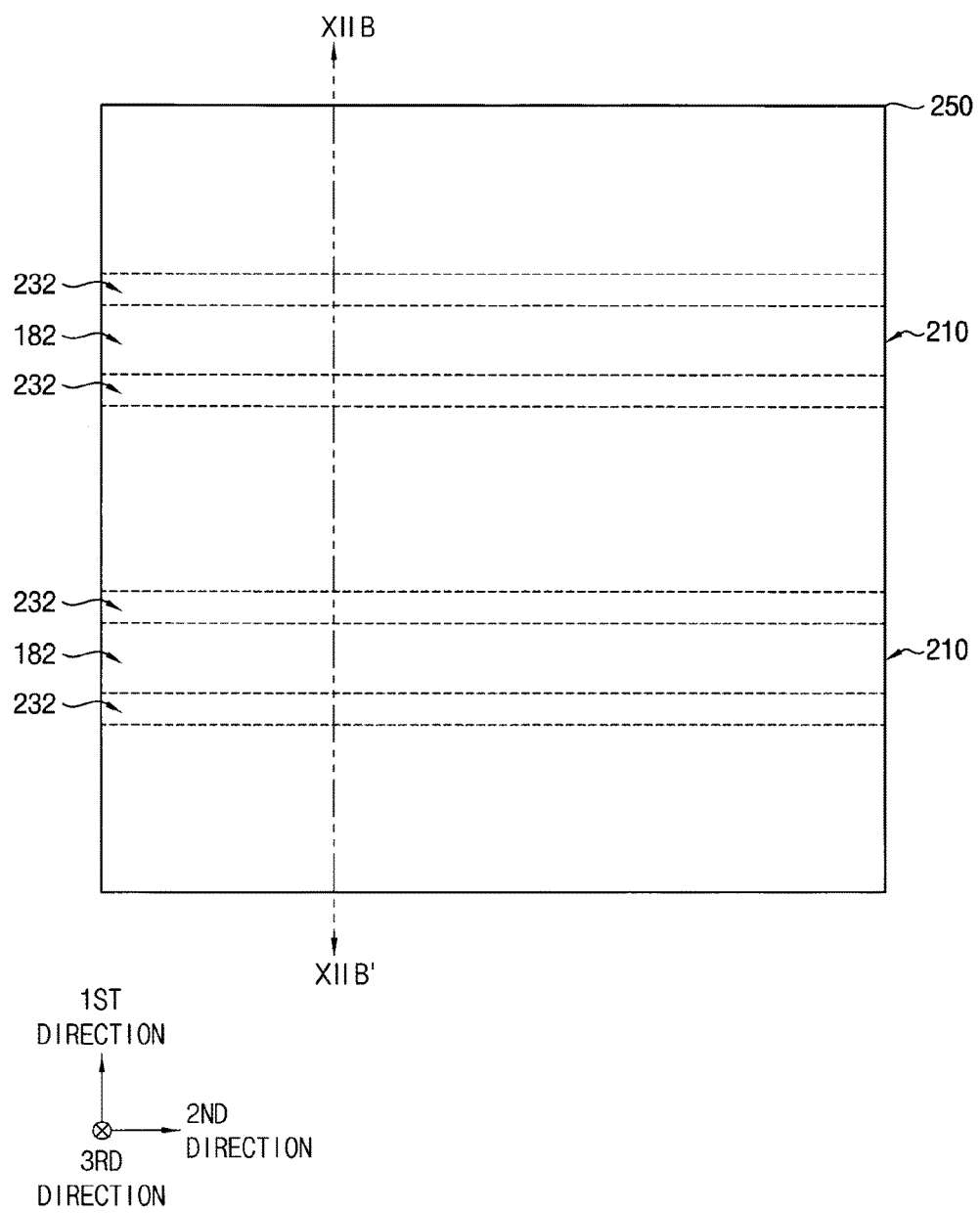
FIG. 12A is a plan view illustrating a stage of a method of manufacturing a variable resistance memory device according to some example embodiments.
Figure 12B:
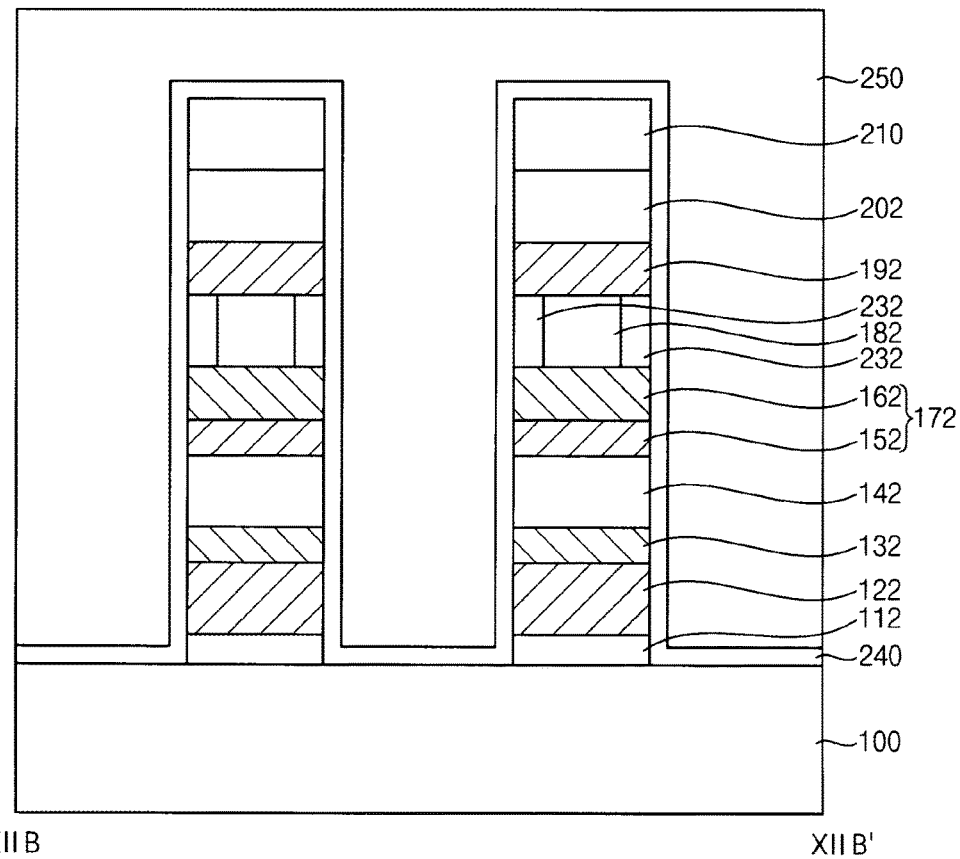
FIG. 12B is a cross-sectional view along line XIIB-XIIB' of FIG. 12A.
Figure 13:
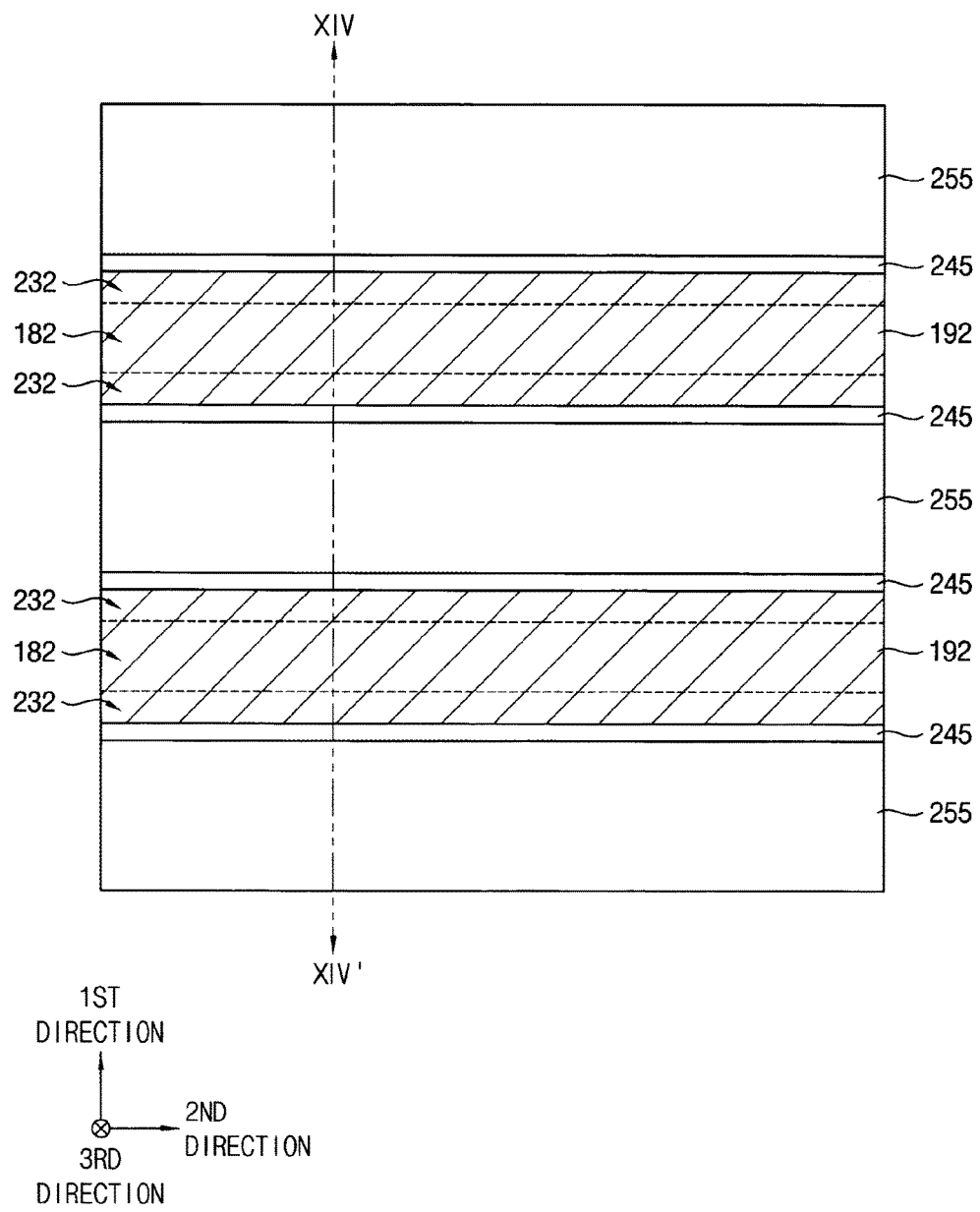
Figure 15:
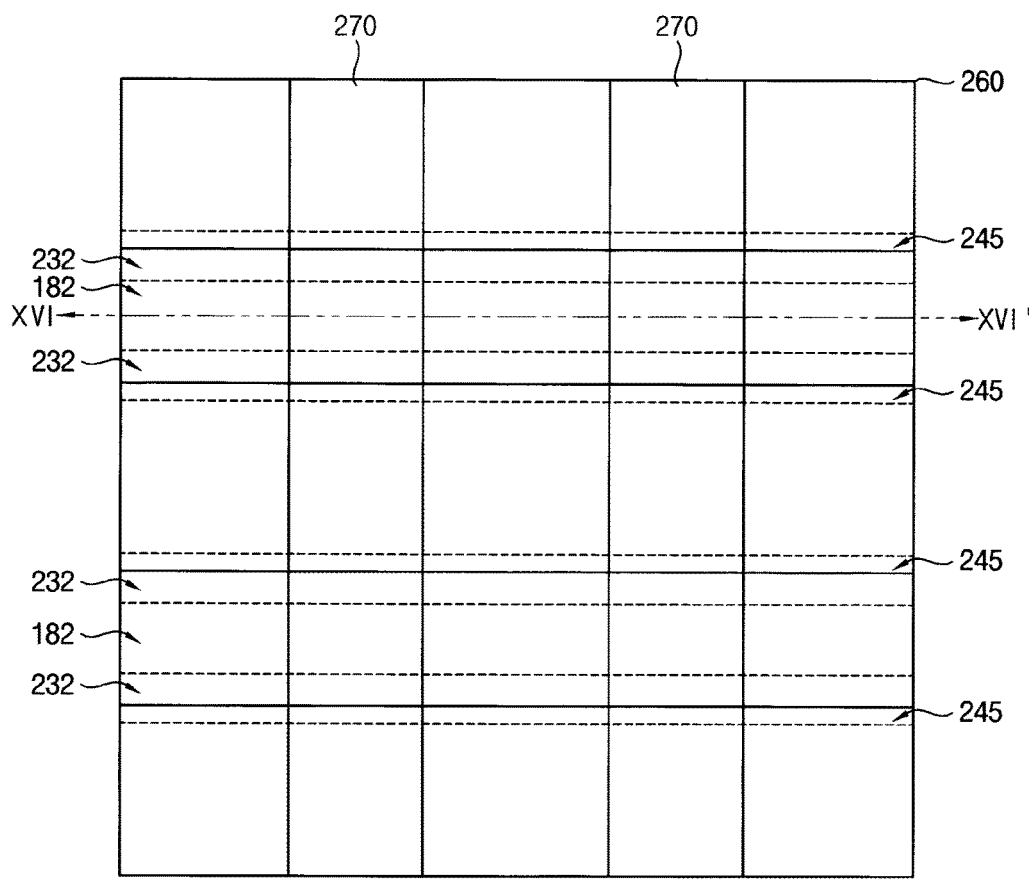
Figure 16:
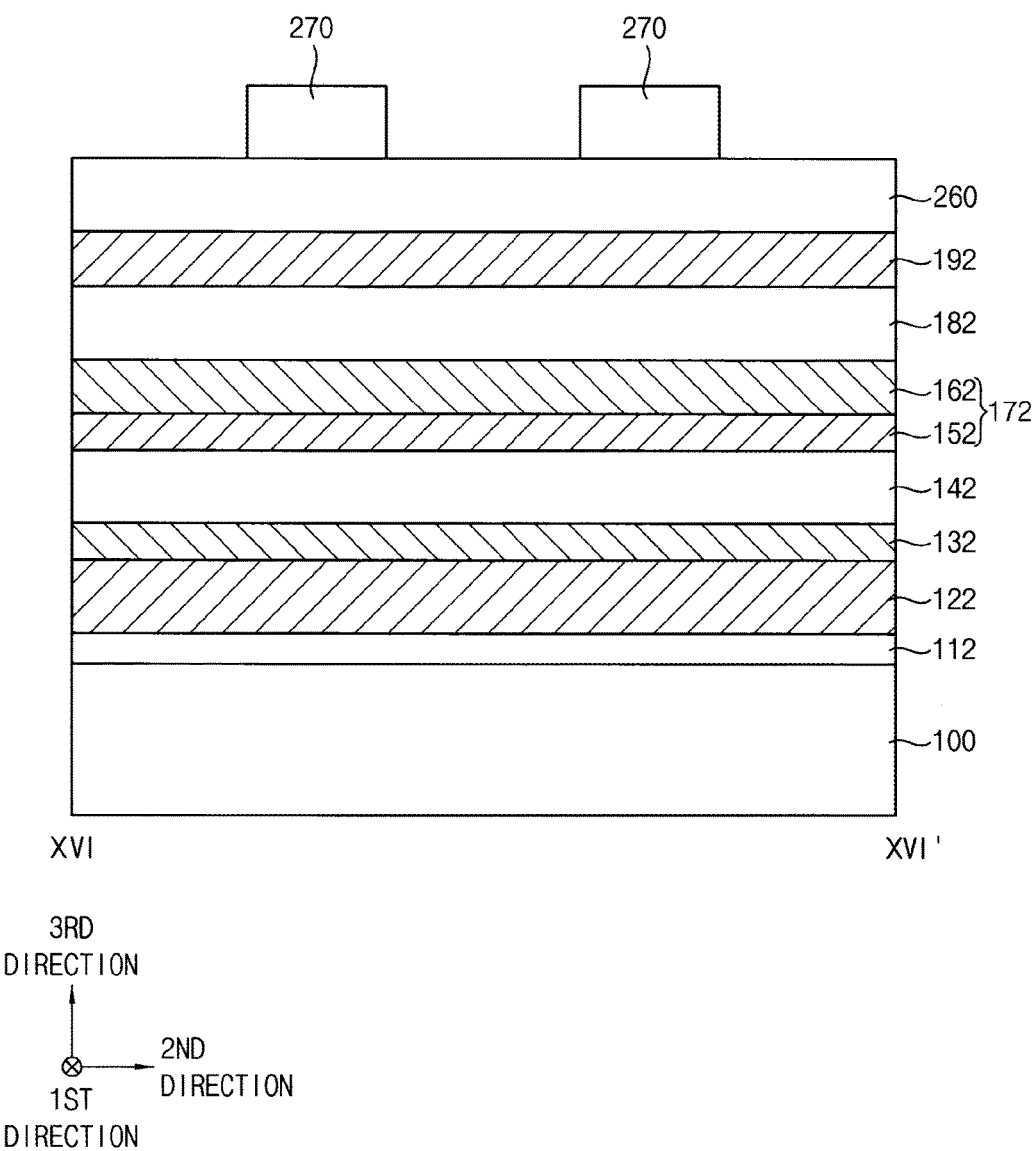
Figure 17:
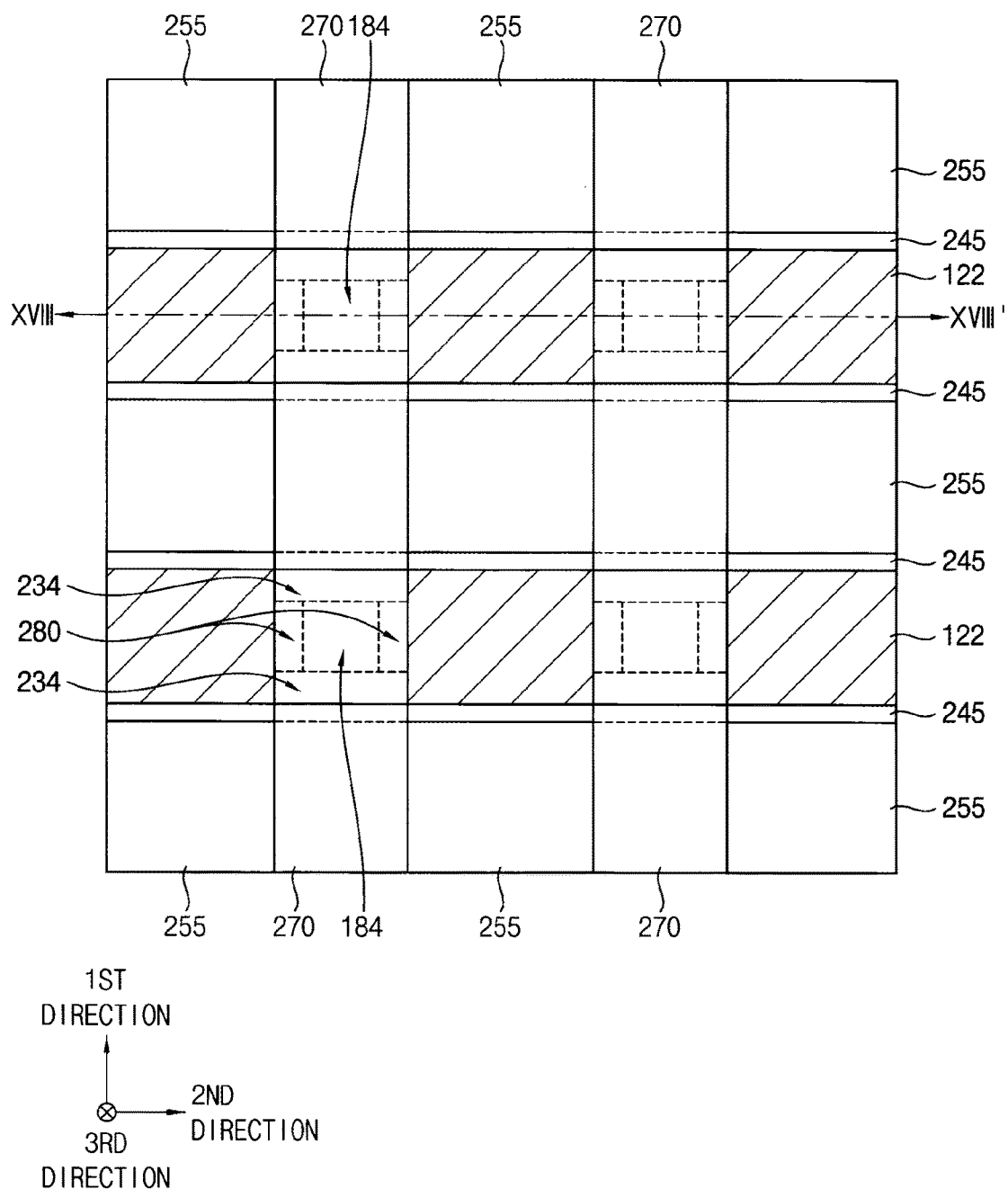
Figure 18:
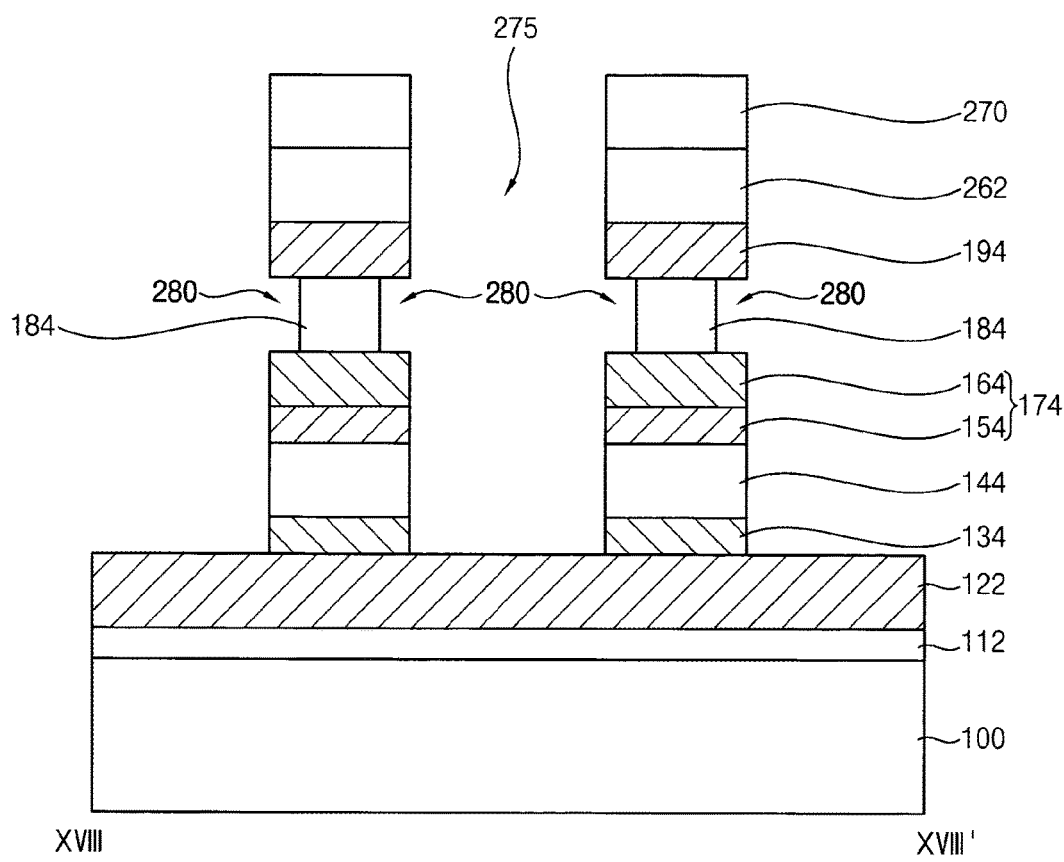
Figure 19:
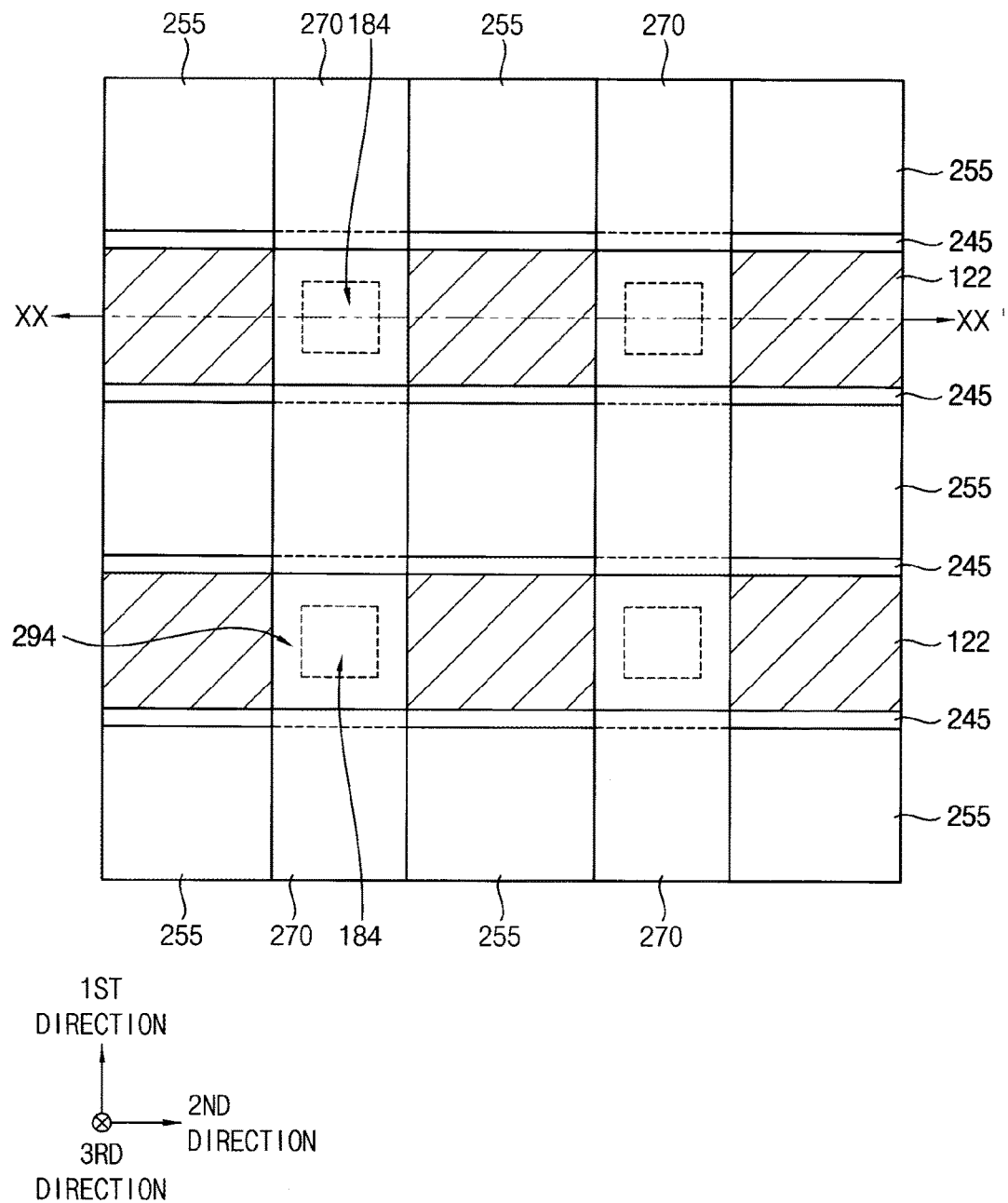
Figure 21:
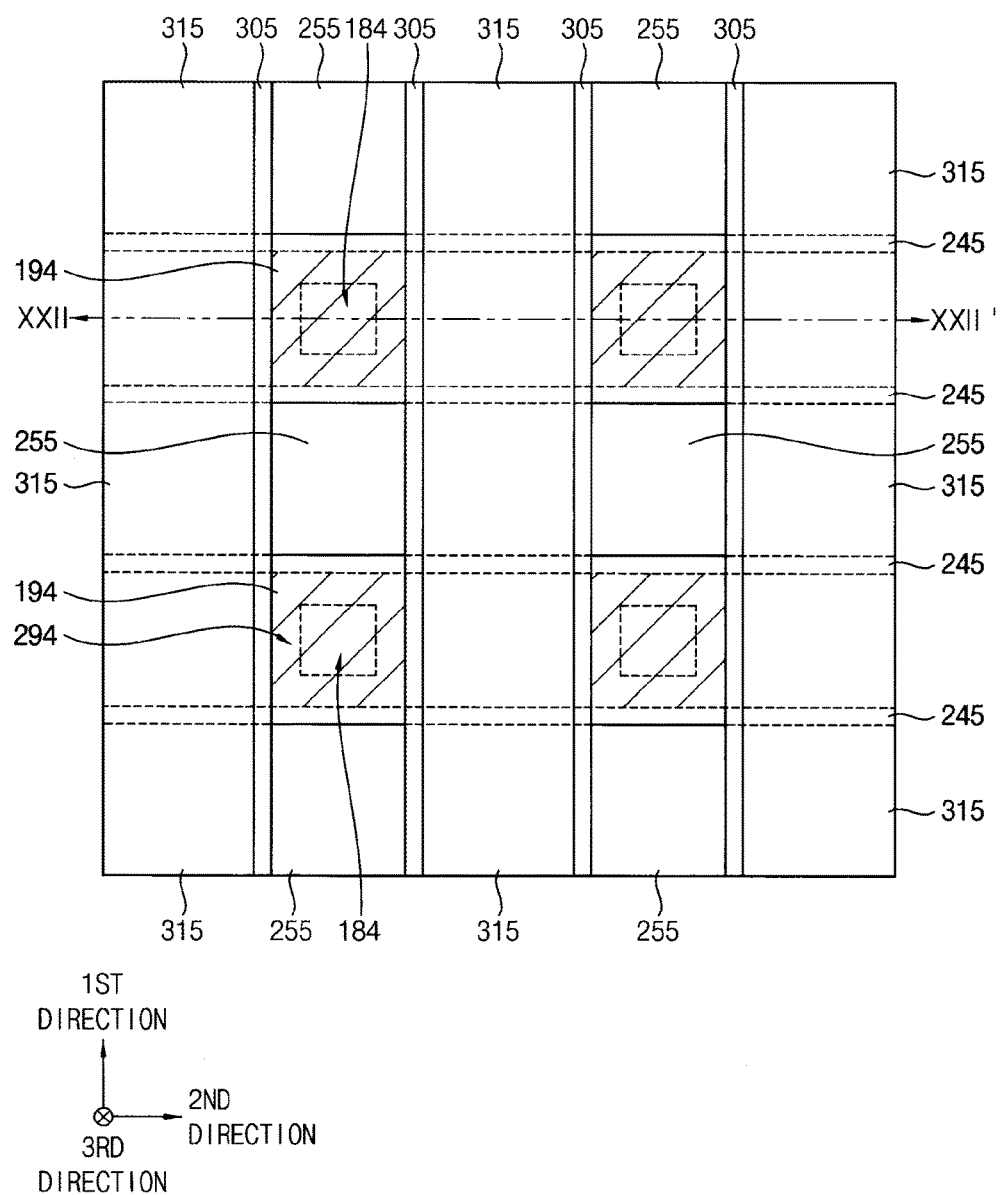
Figure 22:
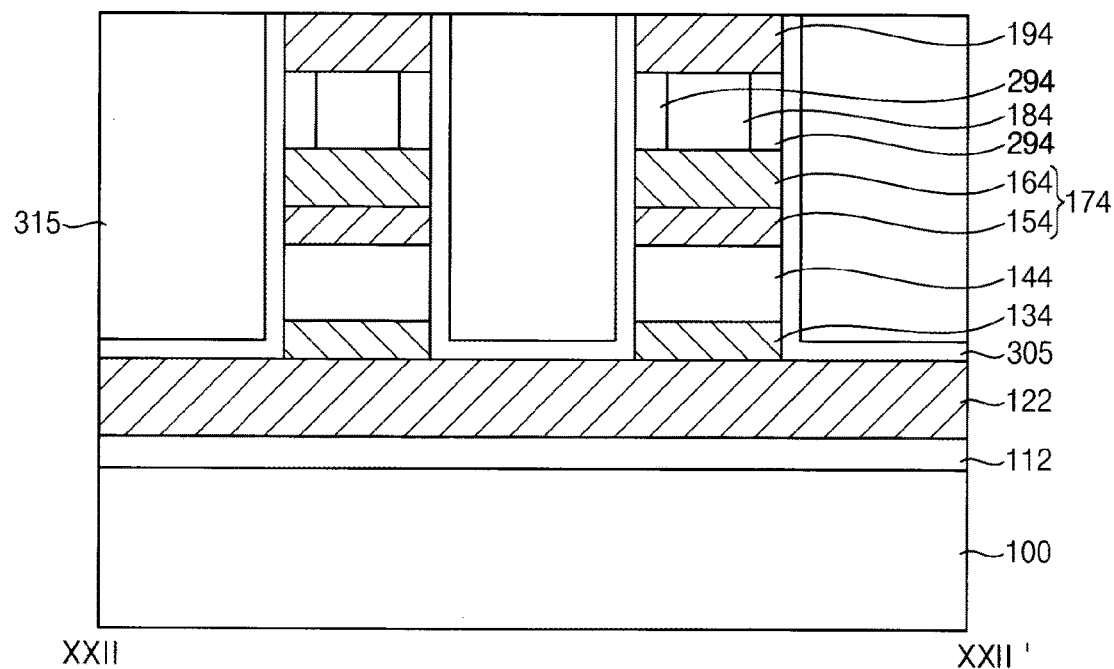

FIGS. 4 to 22 are plan views and cross-sectional views illustrating stages of a method of manufacturing a variable resistance memory device according to some example embodiments. FIG. 4 is a plan view illustrating a stage of a method of manufacturing a variable resistance memory device according to some example embodiments. FIG. 5 is a cross-sectional view illustrating a stage of a method of manufacturing a variable resistance memory device along line V-V' of FIG. 4. FIG. 6A is a plan view illustrating a stage of a method of manufacturing a variable resistance memory device according to some example embodiments. FIG. 6B is a cross-sectional view along line VIB-VIB' of FIG. 6A. FIG. 7 is a plan view illustrating a stage of a method of manufacturing a variable resistance memory device according to some example embodiments. FIG. 8 is a cross-sectional view along line VIII-VIII' of FIG. 7. FIG. 9A is a plan view illustrating a stage of a method of manufacturing a variable resistance memory device according to some example embodiments. FIG. 9B is a cross-sectional view along line IXB-IXB' of FIG. 9A. FIG. 10 is a plan view illustrating a stage of a method of manufacturing a variable resistance memory device according to some example embodiments. FIG. 11 is a cross-sectional view along line XI-XI' of FIG. 10. FIG. 12A is a plan view illustrating a stage of a method of manufacturing a variable resistance memory device according to some example embodiments. FIG. 12B is a cross-sectional view along line XIIIB-XIIIB' of FIG. 12A. FIG. 13 is a plan view illustrating a stage of a method of manufacturing a variable resistance memory device according to some example embodiments. FIG. 14 is a cross-sectional view along line XIV-XIV' of FIG. 13. FIG. 15 is a plan view illustrating a stage of a method of manufacturing a variable resistance memory device according to some example embodiments. FIG. 16 is a cross-sectional view along line XVI-XVI' of FIG. 15. FIG. 17 is a plan view illustrating a stage of a method of manufacturing a variable resistance memory device according to some example embodiments. FIG. 18 is a cross-sectional view along line XVIII-XVIII' of FIG. 17. FIG. 19 is a plan view illustrating a stage of a method of manufacturing a variable resistance memory device according to some example embodiments. FIG. 20 is a cross-sectional view along line XX-XX' of FIG. 19. FIG. 21 is a plan view illustrating a stage of a method of manufacturing a variable resistance memory device according to some example embodiments. FIG. 22 is a cross-sectional view along line XXII-XXII' of FIG. 21;

Referring to FIGS. 4 and 5, a first insulating interlayer 110, a first conductive layer 120, a first electrode layer 130, a first selection layer 140, a second electrode layer structure 170, an insulation layer 180, a third electrode layer 190 and a first mask layer 200 may be sequentially formed on a substrate 100, and a second mask 210 may be formed on the first mask layer 200.

The substrate 100 may include a semiconductor material, e.g., silicon, germanium, silicon-germanium, etc., or III-V semiconductor compounds, e.g., GaP, GaAs, GaSb, etc. In some example embodiments, the substrate 100 may be an SOI substrate, or a GOI substrate.

Various elements, e.g., gate structures, impurity layers, contact plugs, wirings, etc. may be formed on the substrate 100, and may be covered by the first insulating interlayer 110.

The first insulating interlayer 110 may be formed of an insulating material, e.g., silicon oxide, silicon nitride, silicon oxynitride, etc. As referred to herein, an element "formed of" one or more materials will be understood to "at least partially comprise" the one or more materials.

The first conductive layer 120 may be formed of a metal, e.g., tungsten, platinum, palladium, rhodium, ruthenium, iridium, copper, aluminum, titanium, tantalum, etc., or a metal nitride thereof.

Each of the first and third electrode layers 130 and 190 may be formed of a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

In some example embodiments, the first selection layer 140 may be formed of an ovonic threshold switch (OTS) material that may serve as a switching element by the resistance difference due to the temperature difference in an amorphous state.

The OTS material may include, e.g., germanium, silicon, arsenic and/or tellurium, and may further include selenium and/or sulfur.

The OTS material may include, e.g., AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

In some example embodiments, the selection layer 140 may be formed of a polysilicon layer doped with n-type impurities and a polysilicon layer doped with p-type impurities sequentially stacked, e.g., a diode.

In some example embodiments, the second electrode layer structure 170 may be formed to include first and second layers 150 and 160. The first layer 150 may be formed of a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc., and thus may be also referred to as a second electrode layer. The second layer 160 may be formed of carbon, metal containing carbon, or metal nitride containing carbon. For example, the second layer 160 may be formed of carbon, carbonitride, titanium carbonitride and/or tantalum carbonitride. The second layer 160 may be also referred to as a heating layer.

The insulation layer 180 may be formed of an oxide, e.g., silicon oxide.

The first mask layer 200 may be formed of a nitride, e.g., silicon nitride, and the second mask 210 may be formed of an oxide, e.g., silicon oxide. In some cases, the first mask layer 200 may not be formed.

In some example embodiments, the second mask 210 may extend in the second direction, and a plurality of second masks 210 may be formed in the first direction.

Referring to FIGS. 6A-6B, the first mask layer 200 may be etched using the second mask 210 as an etching mask to form a first mask 202, and the third electrode layer 190, the insulation layer 180, the second electrode layer structure 170, the selection layer 140, the first electrode layer 130, the first conductive layer 120 and the first insulating interlayer 110 may be sequentially etched to form a preliminary third electrode 192, a preliminary insulation pattern 182, a preliminary second electrode structure 172, a preliminary selection pattern 142, a preliminary first electrode 132, a first conductive line 122 and a first insulating interlayer pattern 112, respectively. In the etching process, the second mask 210 may be completely or partially removed.

Thus, a first structure including the first insulating interlayer pattern 112, the first conductive line 122, the preliminary first electrode 132, the preliminary selection pattern 142, the preliminary second electrode structure 172, the preliminary insulation pattern 182, the preliminary third electrode 192, the first mask 202 and the second mask 210 sequentially stacked may be formed on the substrate 100. The first structure may extend in the second direction, and a plurality of first structures may be formed to be spaced apart from each other in the first direction. A space between the first structures may be referred to as a first opening 215.

The preliminary second electrode structure 172 may include a preliminary first pattern 152 and a preliminary second pattern 162 sequentially stacked, which may be also referred to as a preliminary second electrode 152 and a preliminary heater 162, respectively.

Referring to FIGS. 7 and 8, the preliminary insulation pattern 182 exposed by the first opening 215 may be removed to form a first gap 220.

In some example embodiments, the first structure including the preliminary insulation pattern 182 may extend in the second direction, and thus the first gap 220 may be formed by removing each of opposite edge portions of the preliminary insulation pattern 182 in the first direction. Thus, each of the first gaps 220 may extend in the second direction, and may be in communication with the first opening 215.

In some example embodiments, the first gap 220 may be formed by an etch back process.

The first gap 220 may provide a space for forming a preliminary first variable resistance pattern 232 (refer to FIGS. 10 and 11) illustrated later, and the size of the preliminary first variable resistance pattern 232 may be controlled by controlling a depth of the first gap 220. The depth of the first gap 220 that may be formed by partially removing the preliminary insulation pattern 182 may not have limitation, and when at least a portion of the preliminary insulation pattern 182 remains, it may be included in the scope of the present inventive concepts.

Referring to FIGS. 9A-9B, a first variable resistance layer 230 may be formed on a sidewall and an upper surface of the first structure and an upper surface of the substrate 100 to fill the first gap 220.

In some example embodiments, the first variable resistance layer 230 may be formed by a chemical vapor deposition (CVD) process, an atomic layer deposition (ALD) process, etc.

In some example embodiments, the first variable resistance layer 230 may be formed of a material whose resistance may be changed according to the phase change thereof. In some example embodiments, the first variable resistance layer 230 may be formed of a chalcogenide material containing germanium, antimony and/or tellurium. In some example embodiments, the first variable resistance layer 230 may include a super lattice having a germanium-tellurium layer and an antimony-tellurium layer alternately stacked. In some example embodiments, the first variable resistance layer 230 may include IST containing indium-antimony-tellurium or BST containing bismuth-antimony-tellurium.

In some example embodiments, the first variable resistance layer 230 may be formed of a perovskite-based material or a transition metal. The perovskite-based material may include, e.g., STO ($SrTiO_3$), BTO ($BaTiO_3$), PCMO ($Pr_{1-x}Ca_xMnO_3$) or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx). These may be used alone or in combination.

In some example embodiments, the first variable resistance layer 230 may be formed of a material whose resistance may be changed by a magnetic field or a spin transfer torque (STT). For example, the first variable resistance layer 230 may be formed of a ferromagnetic material, e.g., iron (Fe), nickel (Ni), cobalt (Co), dysprosium (Dy), gadolinium (Gd) or the like.

Referring to FIGS. 10 and 11, the first variable resistance layer 230 may be partially removed to form the preliminary first variable resistance pattern 232 in the first gap 220.

In some example embodiments, the first variable resistance layer 230 may be removed by a dry etching process, and only a portion of the first variable resistance layer 230 in the first gap 220 may remain, which may form the preliminary first variable resistance pattern 232. The dry etching process may focus only on the first variable resistance layer 230, and thus may be performed using only an etching gas for properly removing the first variable resistance layer 230. That is, variable types of layers may not be simultaneously removed in the dry etching process, but only the first variable resistance layer 230 may be removed in the dry etching process, and thus there is no need using various etching gases.

In some example embodiments, the preliminary first variable resistance pattern 232 may extend in the second direction, and may contact each of opposite sidewalls of the preliminary insulation pattern 182 in the first direction.

Hereinafter, the first structure and the preliminary first variable resistance pattern 232 may be referred to as a second structure.

Referring to FIGS. 12A-12B, a first capping layer 240 may be formed on a sidewall and an upper surface of the second structure and the upper surface of the substrate 100, and a second insulating interlayer 250 may be formed on the first capping layer 240 to fill a remaining portion of the first opening 215.

The first capping layer 240 may be formed of an insulating material, e.g., silicon nitride, silicon oxide, etc. The second insulating interlayer 250 may be formed of an oxide, e.g., silicon oxide.

Referring to FIGS. 13 and 14, the second structure, the first capping layer 240 and the second insulating interlayer 250 may be planarized until an upper surface of the preliminary third electrode 192 may be exposed.

Thus, the first and second masks 202 and 210 of the second structure may be removed to form a third structure, and the first capping layer 240 and the second insulating interlayer 250 may be transformed into a first capping pattern 245 and a second insulating interlayer pattern 255, respectively. The first capping pattern 245 may extend in the second direction, and may cover a sidewall of the third structure and the upper surface of the substrate 100.

In some example embodiments, the planarization process may include a chemical mechanical polishing (CMP) process and/or an etch back process.

Referring to FIGS. 15 and 16, a third mask layer 260 may be formed on the third structure, the first capping pattern 245 and the second insulating interlayer pattern 255, and a fourth mask 270 may be formed on the third mask layer 260.

The third mask layer 260 may be formed of a nitride, e.g., silicon nitride, and the fourth mask 270 may be formed of an oxide, e.g., silicon oxide. In some cases, the third mask layer 260 may not be formed.

In some example embodiments, the fourth mask 270 may extend in the first direction, and a plurality of fourth masks 270 may be formed in the second direction.

Referring to FIGS. 17 and 18, processes substantially the same (e.g., that same within manufacturing tolerances and/or material tolerances) as or similar to those illustrated with reference to FIGS. 6 to 8 may be performed.

That is, the third mask layer 260 may be etched using the fourth mask 270 as an etching mask to form a third mask 262, and the preliminary third electrode 192, the preliminary insulation pattern 182, the preliminary first variable resistance pattern 232, the preliminary second electrode structure 172, the preliminary selection pattern 142, and the preliminary first electrode 132 may be sequentially etched to form a third electrode 194, an insulation pattern 184, a first variable resistance pattern 234, a second electrode structure 174, a selection pattern 144, and a first electrode 134, respectively. In the etching process, the fourth mask 270 may be completely or partially removed. Additionally, upper portions of the first capping pattern 245 and the second insulating interlayer pattern 255 may be removed, so that upper surfaces of the first capping pattern 245 and the second insulating interlayer pattern 255 may be substantially coplanar (e.g., coplanar within manufacturing tolerances and/or material tolerances) with an upper surface of the first conductive line 122.

Thus, a fourth structure including the first electrode 134, the selection pattern 144, the second electrode structure 174, the insulation pattern 184, the first variable resistance pattern 234, the third electrode 194, the third mask 262 and the fourth mask 270 sequentially stacked may be formed on each of the first conductive line 122. A plurality of fourth structures may be formed on each of the first conductive lines 122 in the second direction. A space between the fourth structures may be referred to as a second opening 275.

The second electrode structure 174 may include first and second patterns 154 and 164 sequentially stacked, and may be also referred to as a second electrode 154 and a heater 164, respectively.

A portion of the insulation pattern 184 exposed by the second opening 275 may be removed to form a second gap 280.

In some example embodiments, the second gap 280 may be formed by removing each of opposite edge portions of the insulation pattern 184 in the second direction, and may be in communication with the second opening 275.

In some example embodiments, the second gap 280 may be formed by an etch back process.

Referring to FIGS. 19 and 20, processes substantially the same as or similar to those illustrated with reference to FIGS. 9 to 11 may be performed.

That is, a second variable resistance layer may be formed on a sidewall and an upper surface of the fourth structure and upper surfaces of the first conductive line 122, the first capping pattern 245 and the second insulating interlayer pattern 255 to fill the second gap 280, and may be partially removed by a dry etching process to form a second variable resistance pattern in the second gap 280. The dry etching process may focus only on the second variable resistance layer, and thus may be performed using only an etching gas for properly removing the second variable resistance layer.

In some example embodiments, the second variable resistance pattern may contact each of opposite sidewalls of the insulation pattern 184 in the second direction, and may be merged to the first variable resistance pattern 234. The merged first and second variable resistance patterns may be defined as a variable resistance pattern 294.

In some example embodiments, the variable resistance pattern 294 may be formed to have a ring shape. In some example embodiments, the variable resistance pattern 294 may have a rectangular ring shape. In some example embodiments, the variable resistance pattern 294 may have a circular ring shape or an elliptical ring shape.

The fourth structure and the variable resistance pattern 294 may be referred to as a fifth structure.

Referring to FIGS. 21 and 22, processes substantially the same as or similar to those illustrated with reference to FIGS. 12A to 14.

That is, a second capping layer may be formed on a sidewall and an upper surface of the fifth structure and the upper surfaces of the first conductive line 122, the first capping pattern 245 and the second insulating interlayer pattern 255, and a third insulating interlayer may be formed on the second capping layer to fill a remaining portion of the second opening 275.

The second capping layer may be formed of an insulating material, e.g., silicon nitride, silicon oxide, etc. The third insulating interlayer may be formed of an oxide, e.g., silicon oxide.

The fifth structure, the second capping layer and the third insulating interlayer may be planarized until an upper surface of the third electrode 194 may be exposed, and the third and fourth masks 262 and 270 of the fifth structure may be removed to form a sixth structure, and the second capping layer and the third insulating interlayer may be transformed into a second capping pattern 305 and a third insulating interlayer pattern 315, respectively. The first capping pattern 245 and the second insulating interlayer pattern 255 under the third and fourth masks 262 and 270 may be exposed.

The second capping pattern 305 may extend in the first direction, and may cover a sidewall of the sixth structure, and the upper surfaces of the first conductive line 122, the first capping pattern 245 and the second insulating interlayer pattern 255.

Referring to FIGS. 1 to 3 again, a second conductive line 322 may be formed on the sixth structure, the first capping pattern 245 and the second insulating interlayer pattern 255 to extend in the second conductive line 322, and a fourth insulating interlayer pattern 540 may be formed on the second capping pattern 305 and the third insulating interlayer pattern 315 to cover a sidewall of the second conductive line 322, and thus the variable resistance memory device may be completed.

In some example embodiments, the second conductive line 322 may be formed by forming a second conductive layer on the sixth structure, the first capping pattern 245, the second insulating interlayer pattern 255, the second capping pattern 305 and the third insulating interlayer pattern 315, and patterning the second conductive layer using an etching mask extending in the first direction. The fourth insulating interlayer pattern 540 may be formed by forming a fourth insulating interlayer on the second capping pattern 305 and the third insulating interlayer pattern 315 to cover the second conductive line 322, and planarizing the fourth insulating interlayer until an upper surface of the second conductive line 322 may be exposed.

The second conductive layer may be formed of a metal, e.g., tungsten, platinum, palladium, rhodium, ruthenium, iridium, copper, aluminum, titanium, tantalum, etc., or a metal nitride thereof, and the fourth insulating interlayer may be formed of an oxide, e.g., silicon oxide.

In some example embodiments, the second conductive line 322 may be formed by a damascene process. Particularly, the fourth insulating interlayer may be formed on the sixth structure, the first capping pattern 245, the second insulating interlayer pattern 255, the second capping pattern 305 and the third insulating interlayer pattern 315, and a third opening exposing upper surfaces of the sixth structure, the first capping pattern 245 and the second insulating interlayer pattern 255 may be formed to extend in the first direction. The second conductive layer may be formed on the sixth structure, the first capping pattern 245, the second insulating interlayer pattern 255 and the fourth insulating interlayer to fill the third opening, and the second conductive layer may be planarized until an upper surface of the fourth insulating interlayer may be exposed. In some example embodiments, when the damascene process is performed, the second conductive line 322 may be formed to include a metal pattern (not shown) and a barrier pattern (not shown) covering a sidewall and a lower surface of the metal pattern.

The first conductive line 122 may be also formed by a damascene process, and in this case, the first conductive line 122 may be formed to include a metal pattern (not shown) and a barrier pattern (not shown) covering a sidewall and a lower surface of the metal pattern.

As illustrated above, the variable resistance memory device may be formed not by forming a variable resistance layer between the second electrode layer structure 170 and the third electrode layer 190 and simultaneously etching the layer structure including the second electrode layer structure 170 and the third electrode layer 190, but by forming an insulation layer 180 instead of the variable resistance layer, partially removing the insulation layer 180 to form the gaps 220 and 280, and forming the variable resistance pattern 294 to fill the gaps 220 and 280. Thus, the variable resistance pattern 294 may not be etched with other layers, and accordingly may not be exposed to various etching gases and damaged by the etching gases.

The variable resistance pattern 294 may be formed to fill the gaps 220 and 280 that may be formed by partially removing the insulation layer 180, and thus may have a desired size or area by controlling the removal process. Accordingly, the contact area between the variable resistance pattern 294 and the second electrode structure 174 may be easily controlled, and the consumption current may be reduced.

Figure 23:
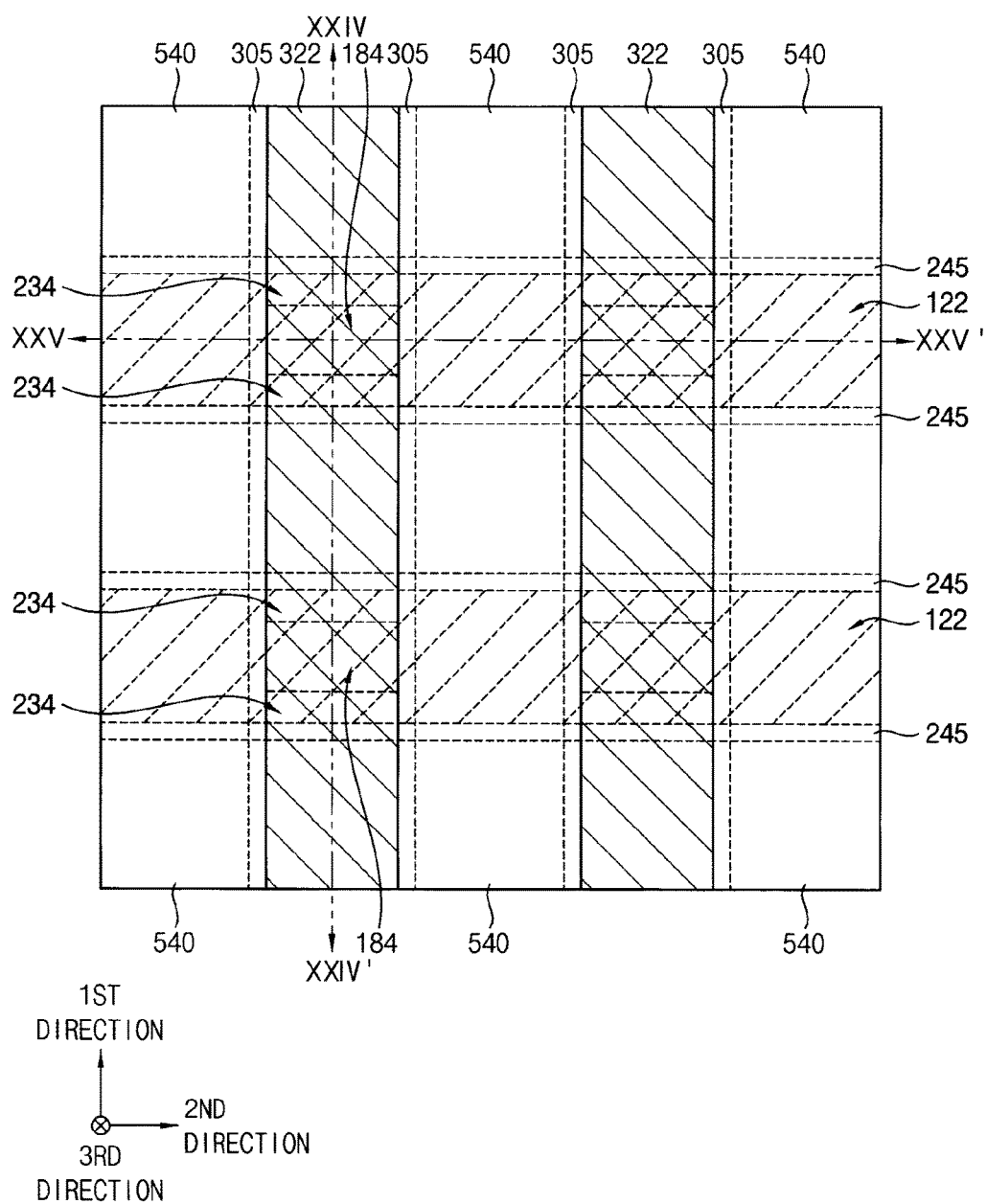
Figure 24:
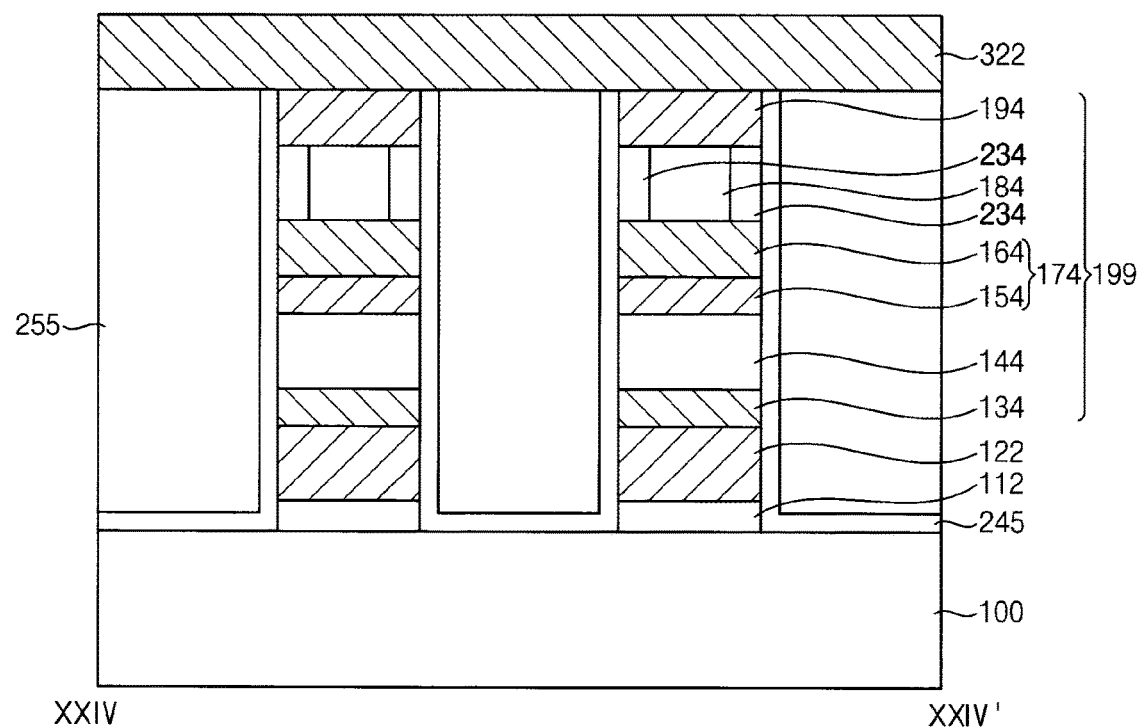

FIG. 23 is a plan view illustrating a variable resistance memory device according to some example embodiments, and FIGS. 24 and 25 are cross-sectional views illustrating the variable resistance memory device of FIG. 23. FIG. 24 is a cross-sectional view along line XXIV-XXIV' of FIG. 23. FIG. 25 is a cross-sectional view along line XXV-XXV' of FIG. 23.

The variable resistance memory device may be substantially the same as or similar to that illustrated with reference to FIGS. 1 to 3, except for the insulation pattern and the variable resistance pattern. Thus, like reference numerals refer to like elements, and detailed descriptions thereon are omitted herein.

Referring to FIGS. 23 to 25, the variable resistance memory device, unlike the variable resistance memory device of FIGS. 1 to 3, may include only the first variable resistance pattern 234 illustrated with reference to FIGS. 17 and 18, and may not include the second variable resistance pattern illustrated with reference to FIGS. 19 and 20.

Thus, the insulation pattern 184 may extend in the second direction in the first memory structure 199, and the first variable resistance pattern 234 may contact each of opposite sidewalls of the insulation pattern 184 in the first direction. That is, the variable resistance pattern of the variable resistance memory device of FIGS. 23 to 25 may not surround all sidewalls of the insulation pattern 184. However, like that of the variable resistance memory device of FIGS. 1 to 3, the variable resistance pattern of the variable resistance memory device of FIGS. 23 to 25 may have an area less than those of the second electrode structure 174 and the third electrode 194 in a plan view.

Figure 26:
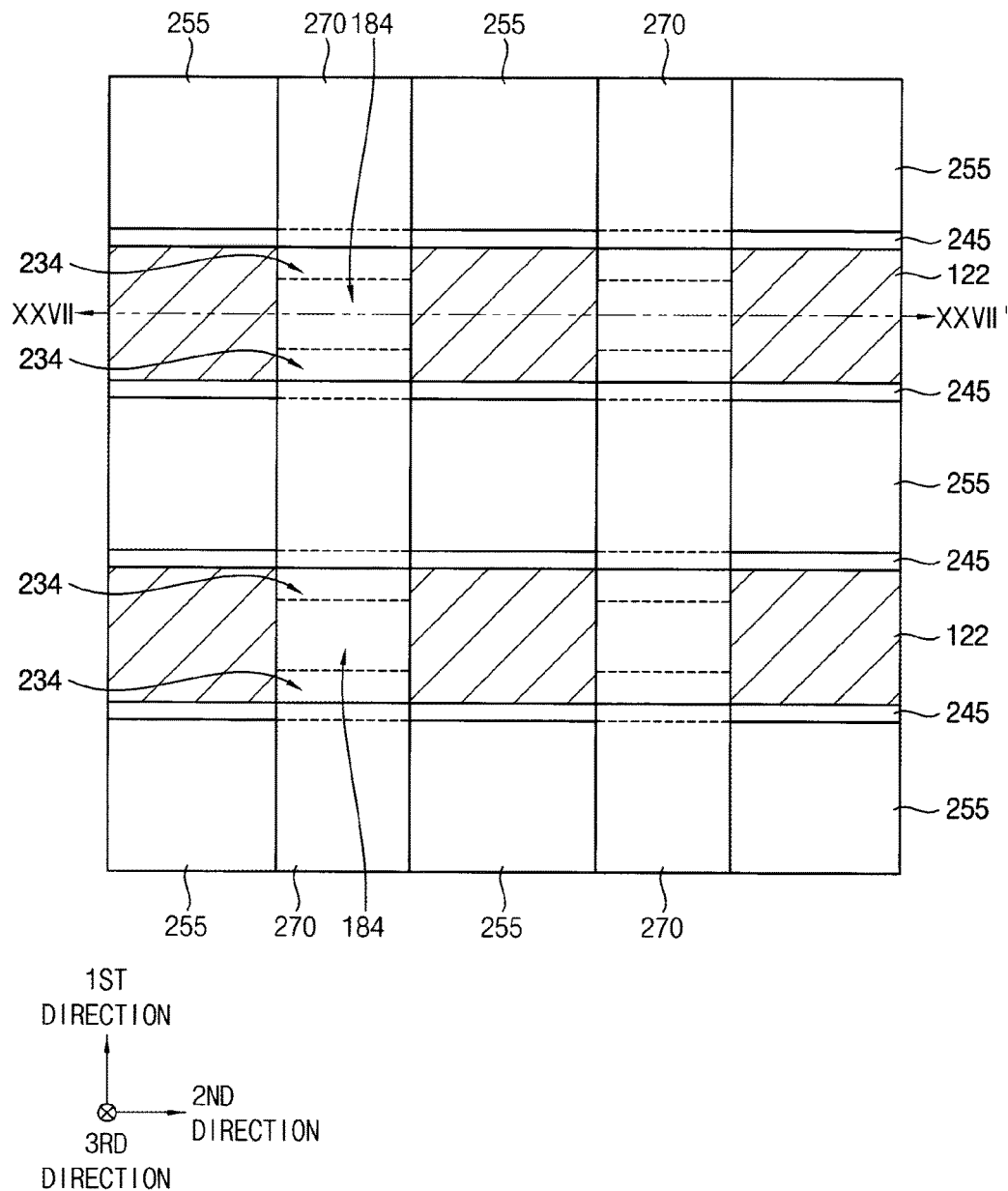
Figure 27:
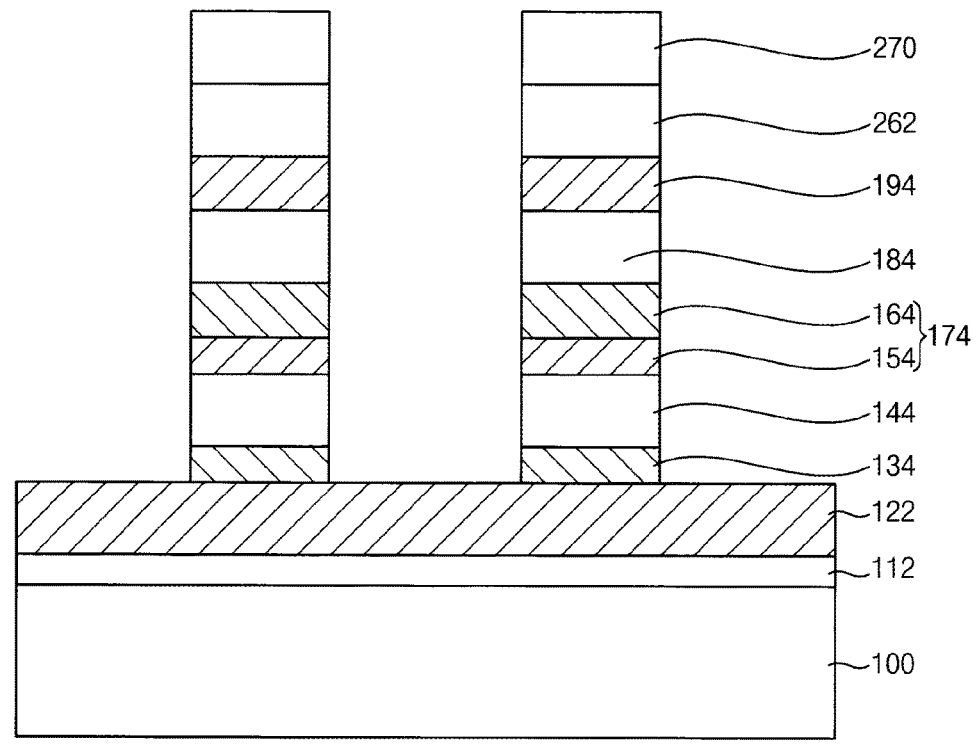

FIGS. 26 and 27 are a plan view and a cross-sectional view illustrating stages of a method of manufacturing a variable resistance memory device according to some example embodiments. FIG. 26 is a plan view, and FIG. 27 is a cross-sectional view along line XXVII-XXVII' of FIG. 26. This method may include processes substantially the same as or similar to those illustrated with reference to FIGS. 4 to 22 and FIGS. 1 to 3, and thus detailed descriptions thereon are omitted herein.

Referring to FIGS. 26 and 27, processes substantially the same as or similar to those illustrated with reference to FIGS. 4 to 18 may be performed.

However, the process for forming the second gap 280 by removing the portion of the insulation pattern 184 exposed by the second opening 275 may not be performed. Thus, opposite edge portions of the insulation pattern 184 in the second direction may not be removed but remain.

Referring to FIGS. 23 to 25 again, processes substantially the same as or similar to those illustrated with reference to FIGS. 19 to 22 and FIGS. 1 to 3 may be performed to complete the variable resistance memory device.

According to the above processes, the opposite edge portions of the preliminary insulation pattern 182 in the first direction may be removed to form the first gaps 220, however, the opposite edge portions of the preliminary insulation pattern 182 in the second direction may not be removed, and thus the second gaps 280 may not be formed. Accordingly, only the first variable resistance pattern 234 contacting opposite sidewalls of the insulation pattern 184 in the first direction may be formed between the second electrode structure 174 and the third electrode 194. The first variable resistance pattern 234 may also have an area less than those of the second electrode structure 174 and the third electrode 194 in a plan view, which may be similar to the variable resistance pattern 294 of FIGS. 1 to 3.

Figure 28:
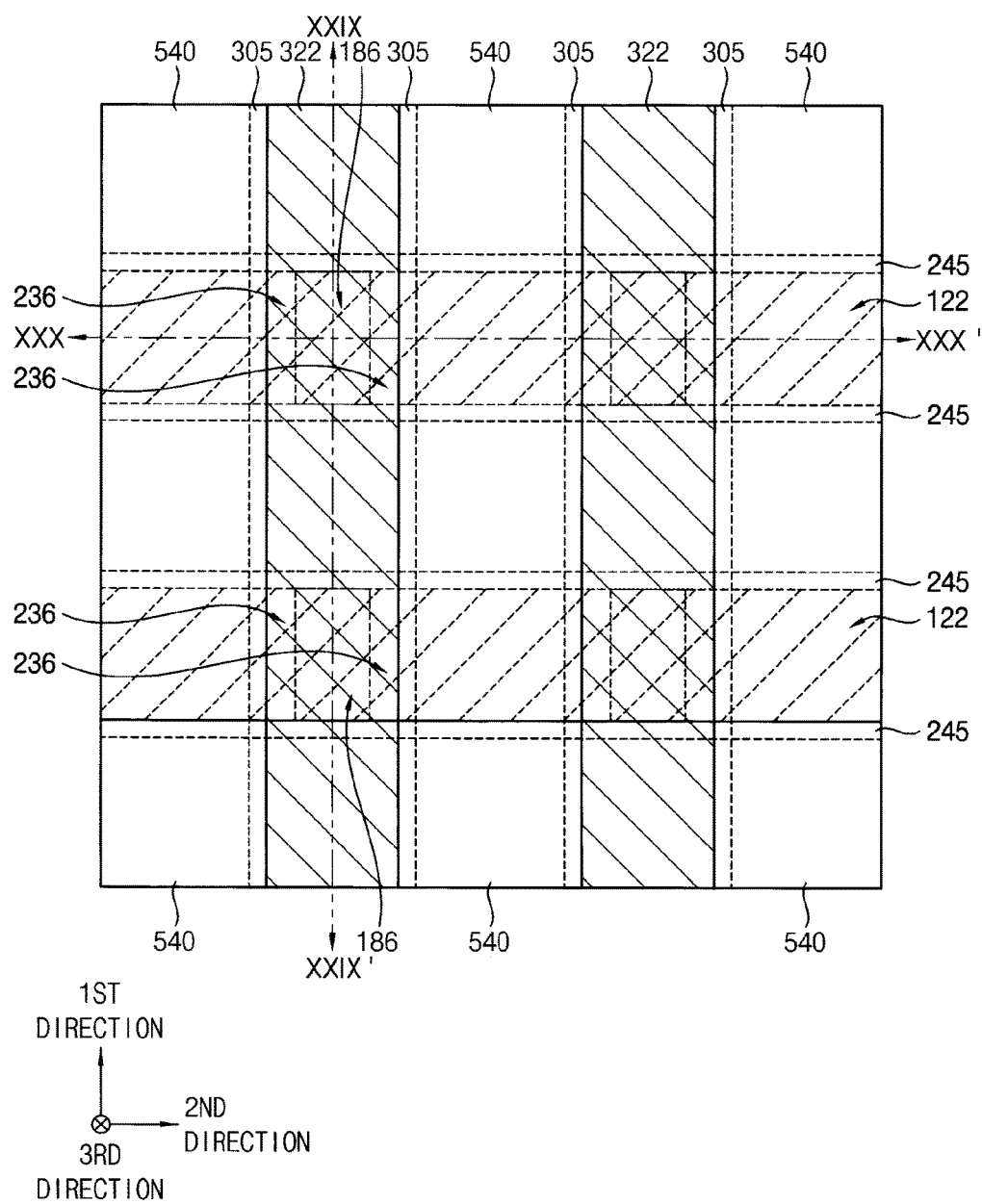
Figure 29:
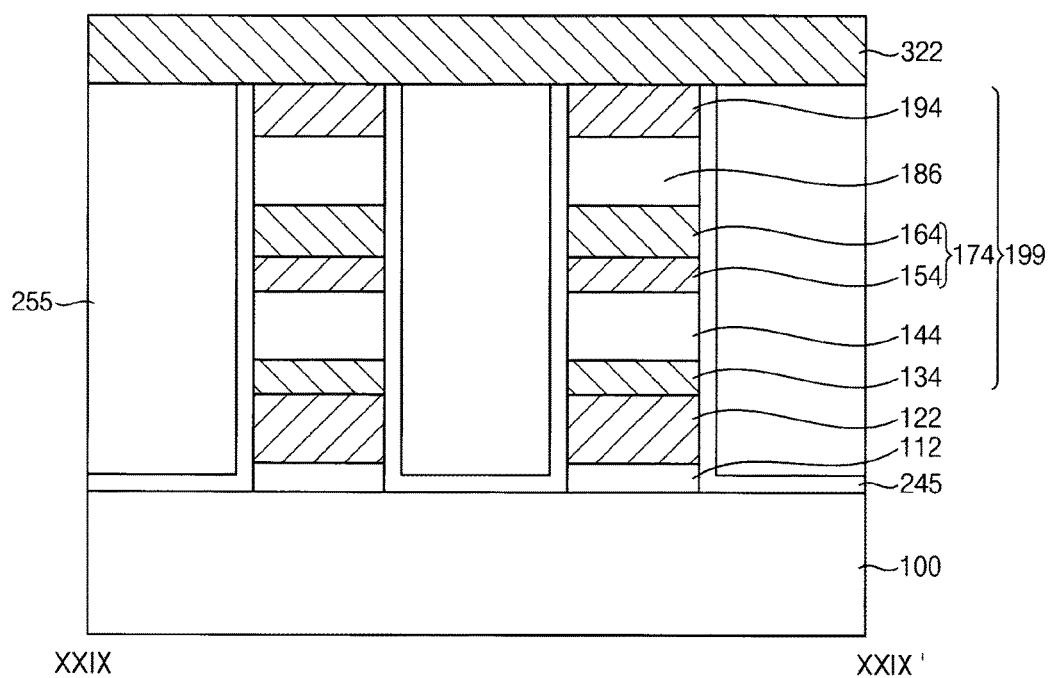
Figure 30:
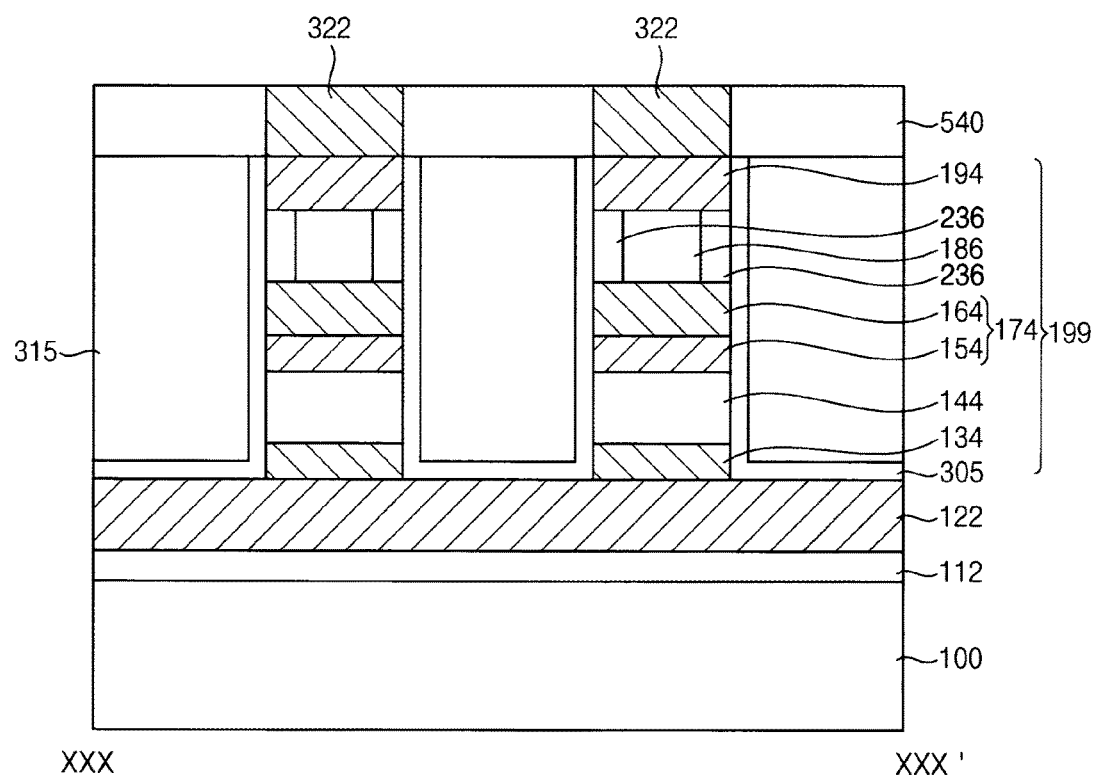

FIG. 28 is a plan view illustrating a variable resistance memory device according to some example embodiments, and FIGS. 29 and 30 are cross-sectional view illustrating the variable resistance memory device. FIG. 29 is a cross-sectional view along line XXIX-XXIX' of FIG. 28. FIG. 30 is a cross-sectional view along line XXX-XXX' of FIG. 28.

The variable resistance memory device may be substantially the same as or similar to that illustrated with reference to FIGS. 1 to 3, except for the shape of the insulation pattern and the variable resistance pattern. Thus, like reference numerals refer to like elements, and detailed descriptions thereon are omitted herein.

Referring to FIGS. 28 to 30, an insulation pattern 186 may extend in the first direction in the first memory structure 199, and a variable resistance pattern 236 may contact each of opposite sidewalls of the insulation pattern 186 in the second direction. Unlike the variable resistance pattern 294 of FIGS. 1 to 3, the variable resistance pattern 236 may not all sidewalls of the insulation pattern 186. However, the variable resistance pattern 236 may have an area less than those of the second electrode structure 174 and the third electrode 194 in a plan view, which may be similar to the variable resistance pattern 294 of FIGS. 1 to 3.

FIGS. 31 to 34 are cross-sectional views illustrating a variable resistance memory device according to some example embodiments. The variable resistance memory device may be substantially the same as or similar to that illustrated with reference to FIGS. 1 to 3, except for the positions of the selection pattern and the heater. Thus, like reference numerals refer to like elements, and detailed descriptions thereon are omitted herein.

Figure 31:
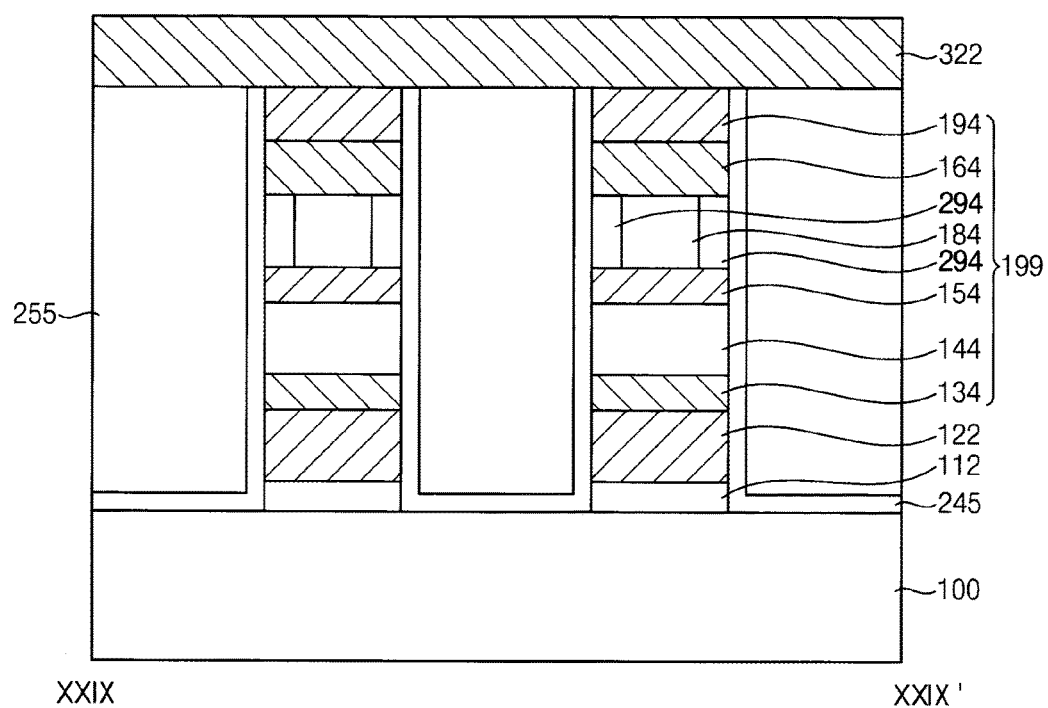

Referring to FIG. 31, the first pattern 154, i.e., the second electrode 154 may be formed beneath the insulation pattern 184 and the variable resistance pattern 294, and the second pattern 164, i.e., the heater 164 may be formed on the insulation pattern 184 and the variable resistance pattern 294. The third electrode 194 may be formed on the heater 164.

Thus, the heater 164 and the third electrode 194 sequentially stacked may form a third electrode structure, and the heater 164 included in the third structure may heat the underlying variable resistance pattern 294 to vary the resistance thereof.

Figure 32:
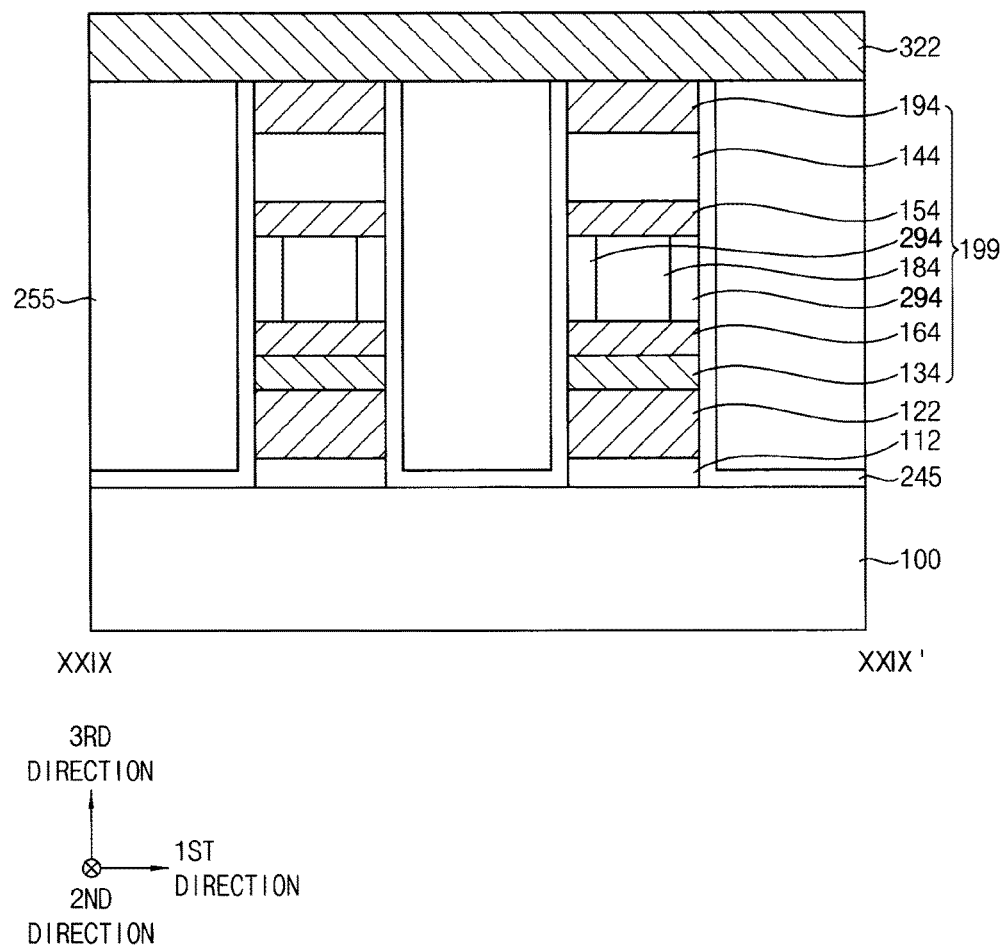

Referring to FIG. 32, the second pattern 164, i.e., the heater 164 may be formed on the first electrode 134, and the insulation pattern 184 and the variable resistance pattern 294 may be formed on the heater 164. Thus, the first electrode 134 and the heater 164 and the third electrode 194 sequentially stacked may form a first electrode structure, and the heater 164 included in the first electrode structure may heat the overlying variable resistance pattern 294 to vary the resistance thereof.

The first pattern 154, i.e., the second electrode 154 may be formed on the insulation pattern 184 and the variable resistance pattern 294, and the selection pattern 144 may be formed between the second electrode 154 and the third electrode 194.

Figure 33:
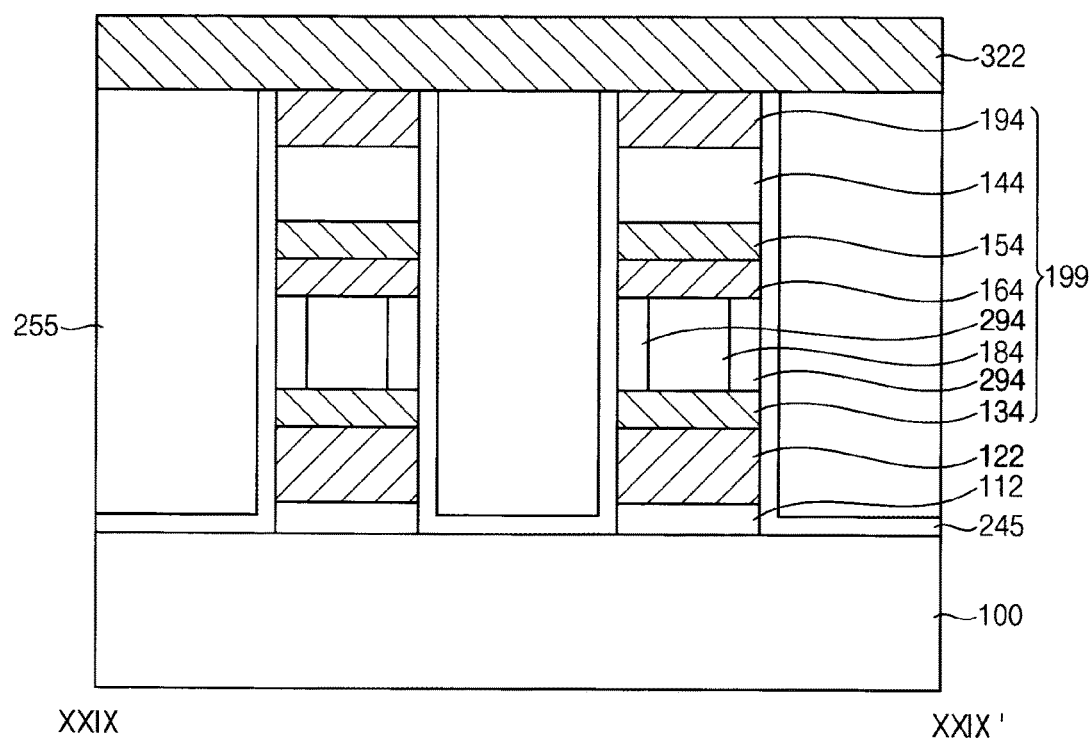

Referring to FIG. 33, the insulation pattern 184 and the variable resistance pattern 294 may be formed on the first electrode 134. The second pattern 164, i.e., the heater 164 may be formed on the insulation pattern 184 and the variable resistance pattern 294, and the first pattern 154, i.e., the second electrode 154 may be formed on the heater 164. Thus, the heater 164 and the second electrode 154 sequentially stacked may form a second electrode structure, and the heater 164 included in the second electrode structure may heat the underlying variable resistance pattern 294 to vary the resistance thereof.

The selection pattern 144 may be formed between the second electrode structure and the third electrode 194.

Figure 34:
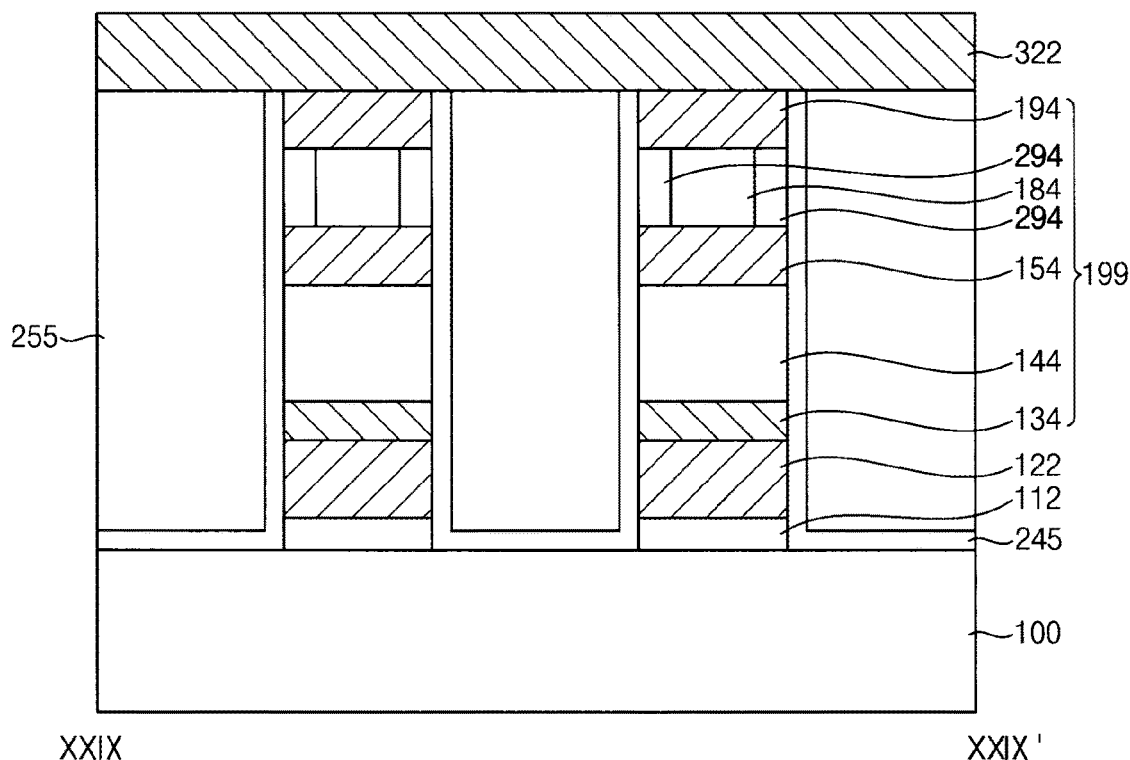

Referring to FIG. 34, the second electrode structure may have a single layer structure. FIG. 34 shows that the second electrode structure includes the first pattern 154, i.e., the second electrode 154. In this case, the variable resistance pattern 294 may provide heat without additional heater.

Figure 35:
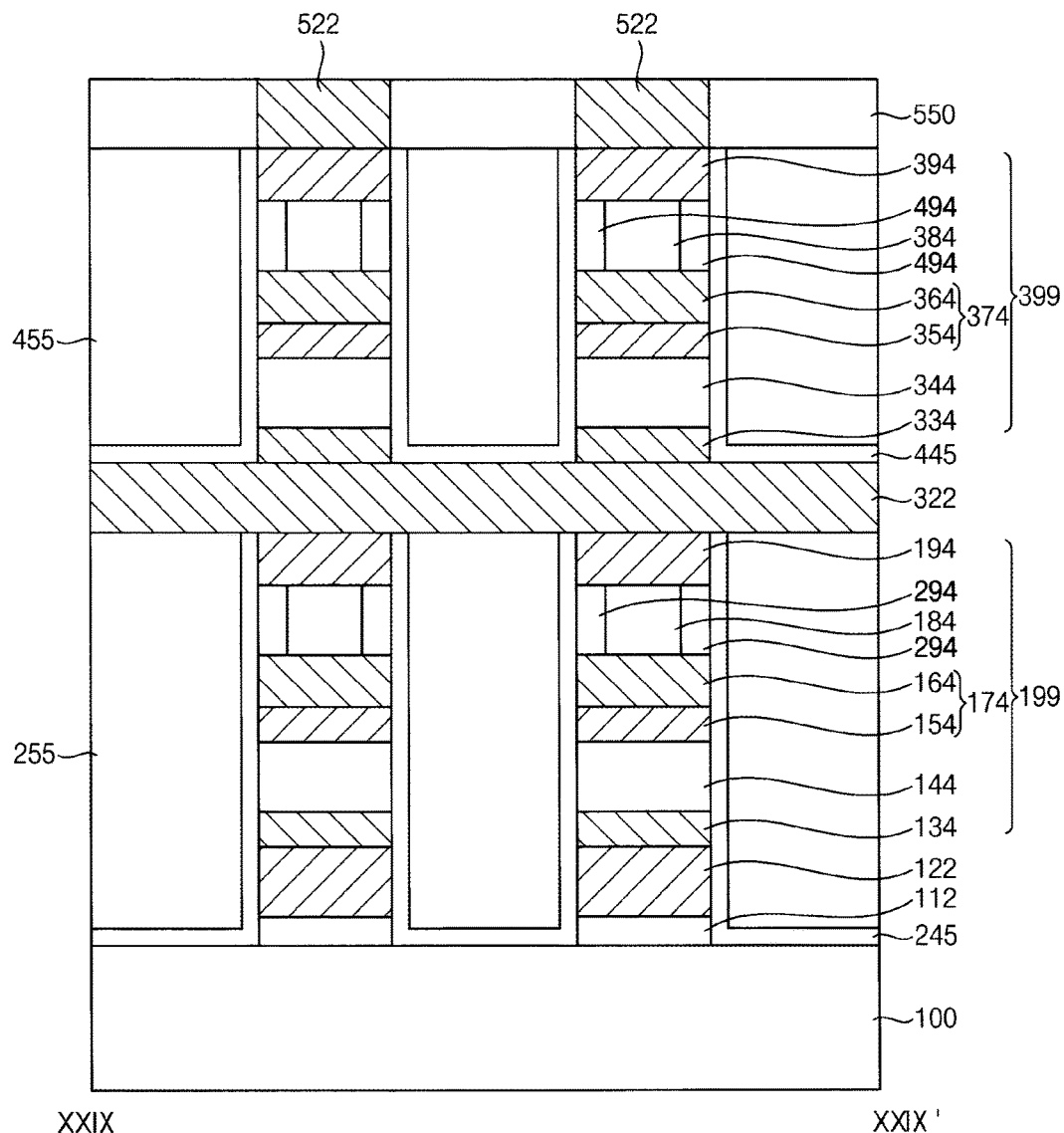

FIGS. 35 and 36 are cross-sectional views illustrating a variable resistance memory device according to some example embodiments. The variable resistance memory device may have a stacked structure including the variable resistance memory devices of FIGS. 1 to 3 sequentially stacked. Thus, like reference numerals refer to like elements, and detailed descriptions thereon may be omitted below in the interest of brevity.

Referring to FIGS. 35 and 36, the variable resistance memory device may include first and second memory structures sequentially stacked in the third direction. Each of the first and second memory structures may be substantially the same as the variable resistance memory device shown in FIGS. 1 to 3. However, the first and second memory structures may share the second conductive line 322. That is, the variable resistance memory device including the first and second memory structures may have only one second conductive line 322.

Accordingly, the first memory structure may include the first and second conductive lines 122 and 322, and a plurality of first memory structures 199 at a region where the first and second conductive lines 122 and 322 overlap each other in the third direction. Each of the first memory structures 199 may include the first electrode 134, the selection pattern 144, the second electrode structure 174, the insulation pattern 184 and the third electrode 194. Each of the first memory structures 199 may further include the variable resistance pattern 294 covering the insulation pattern 184 between the second electrode structure 174 and the third electrode 194. The second electrode structure 174 may include the first and second patterns 154 and 164 sequentially stacked.

The second memory structure may include the second and first conductive lines 322 and 522, and a plurality of second memory structures 399 (also referred to herein as second memories 399) at a region where the second and first conductive lines 322 and 522 overlap each other in the third direction. Each of the second memory structures 399 may include a first electrode 334, a selection pattern 344, a second electrode structure 374, an insulation pattern 384 and a third electrode 394. Each of the second memory structures 399 may further include a variable resistance pattern 494 covering the insulation pattern 384 between the second electrode structure 374 and the third electrode 394. The second electrode structure 374 may include first and second patterns 354 and 364 sequentially stacked.

In some example embodiments, each of the first conductive lines 122 and 522 may extend in the second direction, and a plurality of first conductive lines 122 and a plurality of first conductive lines 522 may be formed in the first direction. The second conductive line 322 may extend in the first direction, and a plurality of second conductive lines 322 may be formed in the second direction.

The insulation pattern 184 and the variable resistance pattern 294 may have shapes substantially the same as those illustrated with reference to FIGS. 1 to 3, and those illustrated with reference to FIGS. 23 to 25 or FIGS. 28 to 30 as well. The variable resistance pattern 294 and the selection pattern 144 may have positions substantially the same as those illustrated with reference to FIGS. 1 to 3, and those illustrated with reference to FIGS. 31 to 34 as well.

In some example embodiments, each of the first conductive lines 122 and 522 may serve as a word line, and the second conductive line 322 may serve as a bit line. In some example embodiments, each of the first conductive lines 122 and 522 may serve as a bit line, and the second conductive line 322 may serve as a word line.

FIGS. 35 and 36 show that the variable resistance memory device includes the first and second memory structures at two levels, respectively, however, the inventive concepts may not be limited thereto, and the variable resistance memory device may include a plurality of memory structures at a plurality of levels, respectively.

Figure 37:
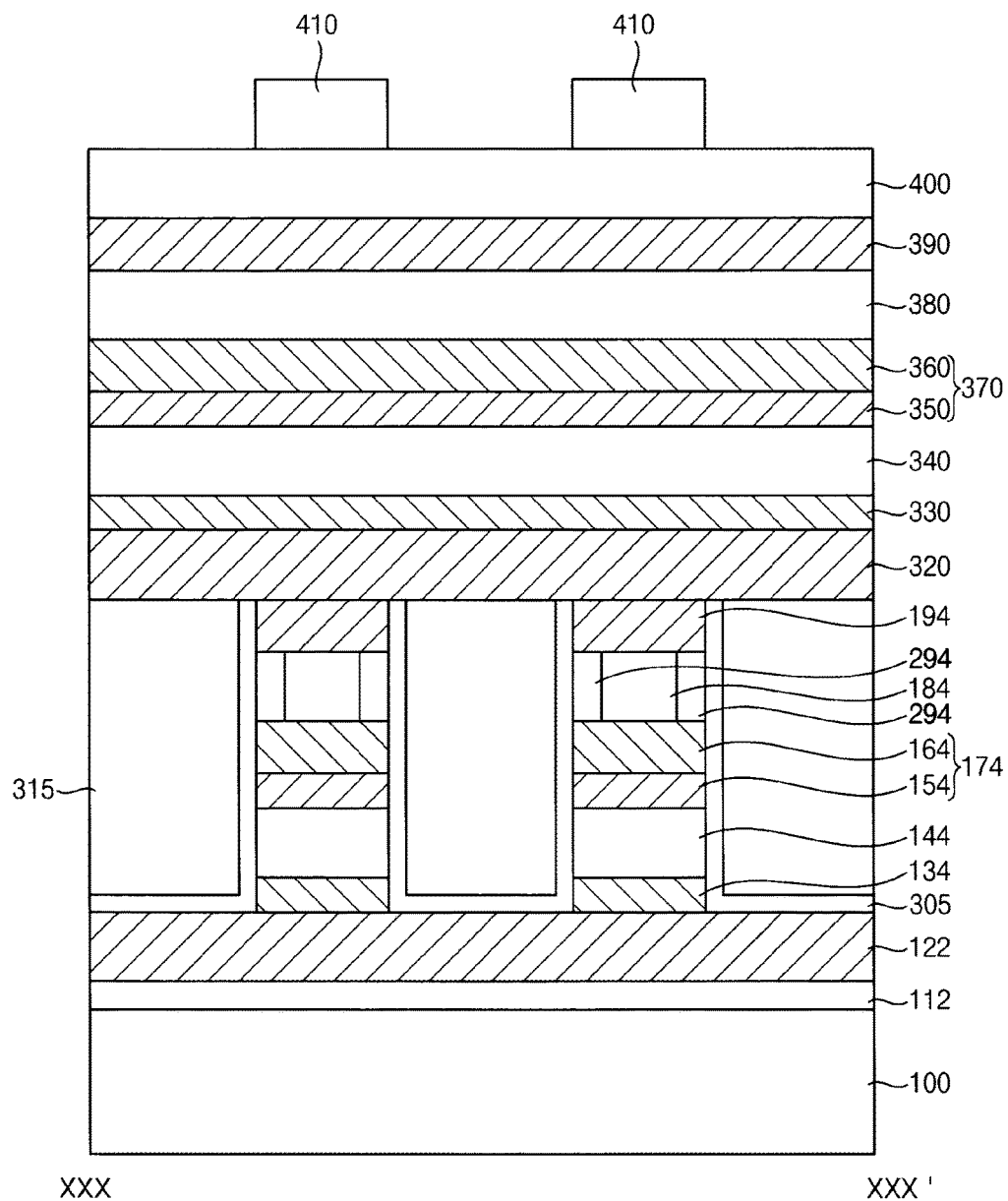

FIGS. 37 and 38 are a plan view and a cross-sectional view illustrating stages of a method of manufacturing a variable resistance memory device according to some example embodiments. This method may include processes substantially the same as or similar to those illustrated with reference to FIGS. 4 to 22 and FIGS. 1 to 3, and thus detailed descriptions thereon are omitted herein.

Referring to FIG. 37, processes substantially the same as or similar to those illustrated with reference to FIGS. 4 to 22 may be performed to form the first memory structure including the first memory structure 199. However, the second conductive line 322 and the fourth insulating interlayer pattern 540 may not be formed.

Processes substantially the same as or similar to those illustrated with reference to FIGS. 4 and 5 may be performed to sequentially form a first conductive layer 320, a first electrode layer 330, a first selection layer 340, a second electrode structure 370, an insulation layer 380, a third electrode layer 390 and a first mask layer 400, and a second mask 410 may be formed on the first mask layer 400.

The second mask 410 may extend in the first direction, and may overlap the first memory structure 199 of the first memory structure in the third direction.

Referring to FIG. 38, processes substantially the same as or similar to those illustrated with reference to FIGS. 6 to 14 to form a third structure extending in the first direction on the plurality of first memory structures 199 disposed in the first direction and including a first conductive line 322, a preliminary first electrode 332, a preliminary selection pattern 342, a preliminary second electrode structure 372, a preliminary insulation pattern 382, a preliminary first variable resistance pattern 432 and a preliminary third electrode 392 sequentially stacked, and a first capping pattern 445 and a second insulating interlayer pattern 455 may be formed to cover opposite sidewalls of the third structure in the second direction, and upper surfaces of the third insulating interlayer pattern 315 and the second capping pattern 305 in the first memory structure.

Referring to FIGS. 35 and 36 again, processes substantially the same as or similar to those illustrated with reference to FIGS. 15 to 22 and FIGS. 1 to 3 may be performed to complete the variable resistance memory device.

The variable resistance memory device according to some example embodiments may be applied to PRAM devices, ReRAM devices, MRAM devices, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable resistance memory device, comprising:
   a pattern of first conductive lines extending in a first direction on a substrate, each of the first conductive lines extending in a second direction substantially orthogonal to the first direction, and the first and second directions substantially parallel to an upper surface of the substrate;
   a pattern of second conductive lines extending in the second direction on the first conductive lines, each of the second conductive lines extending in the first direction;
   a memory structure between the first and second conductive lines, the memory structure vertically overlapping each of at least one first conductive line and at least one second conductive line in a third direction substantially orthogonal to the upper surface of the substrate, the memory structure including,
   an electrode structure,
   an insulation pattern contacting a central surface of the electrode structure, and
   a variable resistance pattern contacting an edge surface of the electrode structure, the variable resistance pattern at least partially covering a sidewall of the insulation pattern; and
   a capping pattern on a sidewall of the electrode structure and a sidewall of the variable resistance pattern.

2. The variable resistance memory device of claim 1, wherein the electrode structure includes,
   a heater; and
   an electrode beneath the heater,
   wherein the heater contacts lower surfaces of the insulation pattern and the variable resistance pattern, respectively.

3. The variable resistance memory device of claim 2, further comprising:
   a selection pattern beneath the electrode structure.

4. The variable resistance memory device of claim 3, further comprising:
   a separate electrode contacting upper surfaces of the insulation pattern and the variable resistance pattern, respectively; and
   an additional electrode contacting a bottom surface of the selection pattern.

5. The variable resistance memory device of claim 1, wherein the electrode structure includes,
   a heater; and
   an electrode on the heater,
   wherein the heater contacts upper surfaces of the insulation pattern and the variable resistance pattern, respectively.

6. The variable resistance memory device of claim 5, further comprising:
   another electrode;
   a selection pattern on the another electrode; and
   an additional electrode on the selection pattern,
   wherein the additional electrode contacts lower surfaces of the insulation pattern and the variable resistance pattern, respectively.

7. A variable resistance memory device, comprising:
   a memory structure including,
   a first electrode on a substrate;
   a selection pattern on the first electrode;
   a second electrode on the selection pattern;
   an insulation pattern on a central upper surface of the second electrode;
   a variable resistance pattern on an edge upper surface of the second electrode, the variable resistance pattern covering at least a portion of a sidewall of the insulation pattern; and
   a third electrode on the insulation pattern and the variable resistance pattern.

8. The variable resistance memory device of claim 7, wherein,
   the insulation pattern extends in a first direction, and
   the variable resistance pattern has a linear shape covering each of opposite sidewalls of the insulation pattern in a second direction substantially orthogonal to the first direction.

9. The variable resistance memory device of claim 7, wherein,
   the second electrode includes first and second patterns sequentially stacked,
   the first pattern includes a metal nitride or a metal silicon nitride, and
   the second pattern includes at least one of carbon, carbonitride, titanium carbonitride, and tantalum carbonitride.

10. The variable resistance memory device of claim 7, further comprising:
    a first conductive line extending in a first direction; and
    a second conductive line extending in a second direction substantially orthogonal to the first direction,
    wherein the memory structure vertically overlaps each of the first conductive line and the second conductive line in a third direction substantially orthogonal to an upper surface of the substrate.

11. A memory structure, comprising:
    an electrode structure;
    an insulation pattern on a central surface of the electrode structure; and
    a variable resistance pattern on an edge surface of the electrode structure, the variable resistance pattern at least partially covering a sidewall of the insulation pattern,
    wherein the electrode structure includes,
    an electrode, and
    a heater on the electrode.

12. The memory structure of claim 11, further comprising:
    a selection pattern beneath the electrode structure.

13. The memory structure of claim 11, wherein the heater includes at least one of carbon, carbonitride, titanium carbonitride, and tantalum carbonitride.

14. The memory structure of claim 11, further comprising:
a separate electrode beneath the electrode;
a selection pattern between the separate electrode and the electrode; and
an additional electrode on upper surfaces of the insulation pattern and the variable resistance pattern, respectively.

15. The memory structure of claim 11, wherein,
the electrode is on upper surfaces of the insulation pattern and the variable resistance pattern, respectively; and
the memory structure further includes,
a selection pattern on an upper surface of the electrode; and
a separate electrode on an upper surface of the selection pattern.

16. The memory structure of claim 11, wherein the variable resistance pattern includes a phase-change material.

17. The memory structure of claim 11, wherein the variable resistance pattern includes a super lattice, IST, or BST, the super lattice including a germanium-tellurium layer and an antimony-tellurium layer alternately stacked, the IST including indium-antimony-tellurium, and the BST including bismuth-antimony-tellurium.

18. The memory structure of claim 11, wherein the electrode structure has a single layer structure.

19. The memory structure of claim 18, wherein the electrode structure includes at least one of titanium nitride, titanium silicon nitride, tungsten nitride, tungsten silicon nitride, tantalum nitride, tantalum silicon nitride, zirconium nitride, and zirconium silicon nitride.

20. The memory structure of claim 11, wherein the variable resistance pattern covers a limited portion of the sidewall of the insulation pattern.

* * * * *